(12) United States Patent
Kuratani et al.

(10) Patent No.: US 8,295,515 B2
(45) Date of Patent: Oct. 23, 2012

(54) SEMICONDUCTOR DEVICE AND MICROPHONE

(75) Inventors: Naoto Kuratani, Kameoka (JP); Kazuyuki Ono, Anjo (JP); Tomofumi Maekawa, Osaka (JP)

(73) Assignee: OMRON Corporation, Kyoto (JP)

( * ) Notice: Subject to any disclaimer, the term of this patent is extended or adjusted under 35 U.S.C. 154(b) by 106 days.

(21) Appl. No.: 13/033,818

(22) Filed: Feb. 24, 2011

(65) Prior Publication Data

US 2011/0222717 A1  Sep. 15, 2011

(30) Foreign Application Priority Data

Mar. 10, 2010  (JP) .................................. 2010-052643

(51) Int. Cl.
*H04R 25/00* (2006.01)

(52) U.S. Cl. ........................................ 381/175; 381/369

(58) Field of Classification Search .................. 381/170, 381/174, 175, 355, 369; 257/680, 704, 708, 257/729, 730

See application file for complete search history.

(56) References Cited

U.S. PATENT DOCUMENTS

| | | | |
|---|---|---|---|
| 2006/0157841 A1* | 7/2006 | Minervini | 257/680 |
| 2007/0058826 A1 | 3/2007 | Sawamoto et al. | |
| 2007/0284714 A1* | 12/2007 | Sakakibara et al. | 257/680 |
| 2008/0283988 A1 | 11/2008 | Huang et al. | |

FOREIGN PATENT DOCUMENTS

| | | |
|---|---|---|
| JP | 2000-236596 A | 8/2000 |
| JP | 2001-169379 A | 6/2001 |
| JP | 2005-340961 A | 12/2005 |
| JP | 2008-271424 A | 11/2008 |
| JP | 2009-289924 A | 12/2009 |
| KR | 10-2005-0112465 A | 11/2005 |

OTHER PUBLICATIONS

Examination Report for Japanese Application No. 2010-052643 dated Nov. 8, 2011, with English translation thereof (7 pages).
Korean Examination Report for Application No. 10-2011-0006709, mailed on Jan. 13, 2012 (6 pages).
Korean Patent Abstracts for Korean Publication No. 10-2005-0112465, publication date Nov. 30, 2005 (1 page).

* cited by examiner

*Primary Examiner* — Brian Ensey
(74) *Attorney, Agent, or Firm* — Osha Liang LLP

(57) ABSTRACT

The semiconductor device has a simplified structure which includes a package structure in which a member for mounting a semiconductor element is separate from a member including a signal input/output unit. A microphone package is configured with a cover and a substrate. A microphone chip and a circuit element are adhered and fixed to a top surface of a recess formed in the cover. A plurality of bonding pads are arranged on the lower surface of the cover on the outer side of the recess. A bonding wire is connected to the circuit element and the bonding pad. The substrate includes a signal input/output terminal serving as the signal input/output unit, and a connection electrode, conducted with the signal input/output terminal, is arranged facing the bonding pad on the upper surface of the substrate. The substrate, cover, connection electrode, and bonding pad are joined with a conductive member.

16 Claims, 32 Drawing Sheets

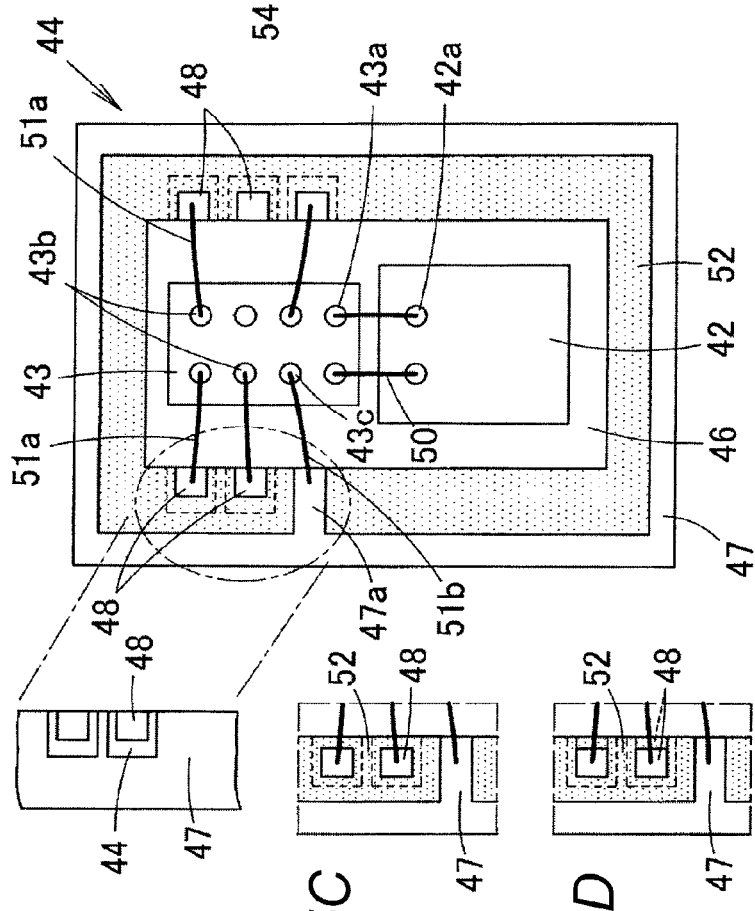
FIG. 5A
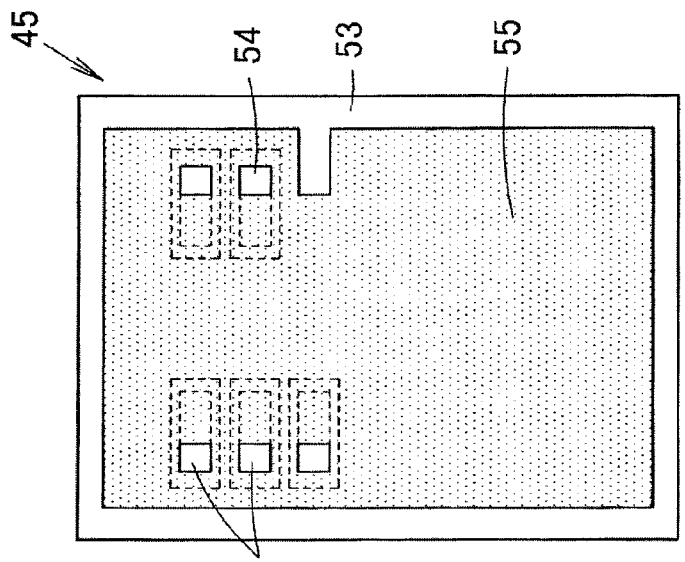
FIG. 5B
FIG. 5C
FIG. 5D

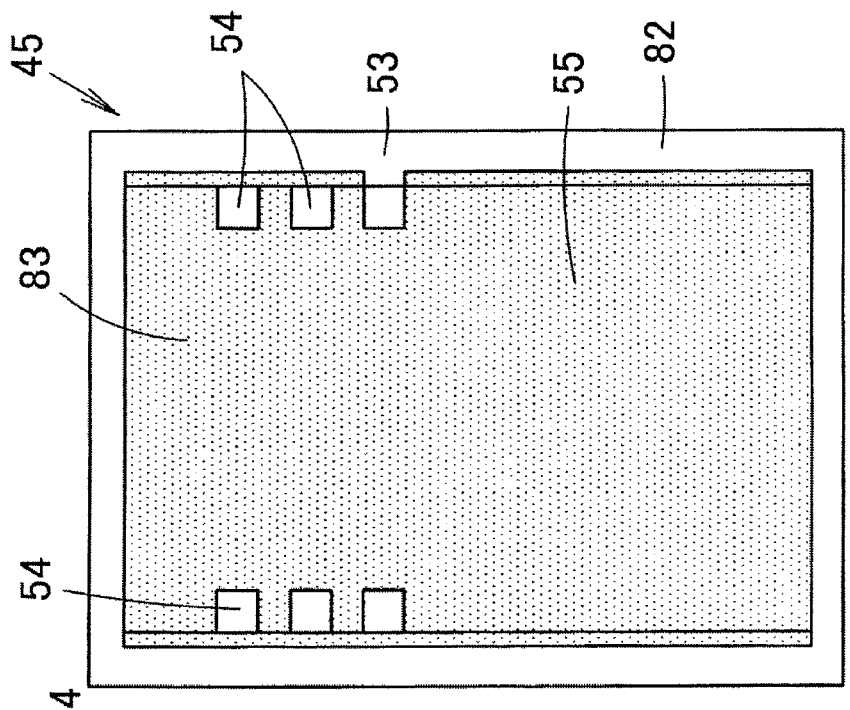
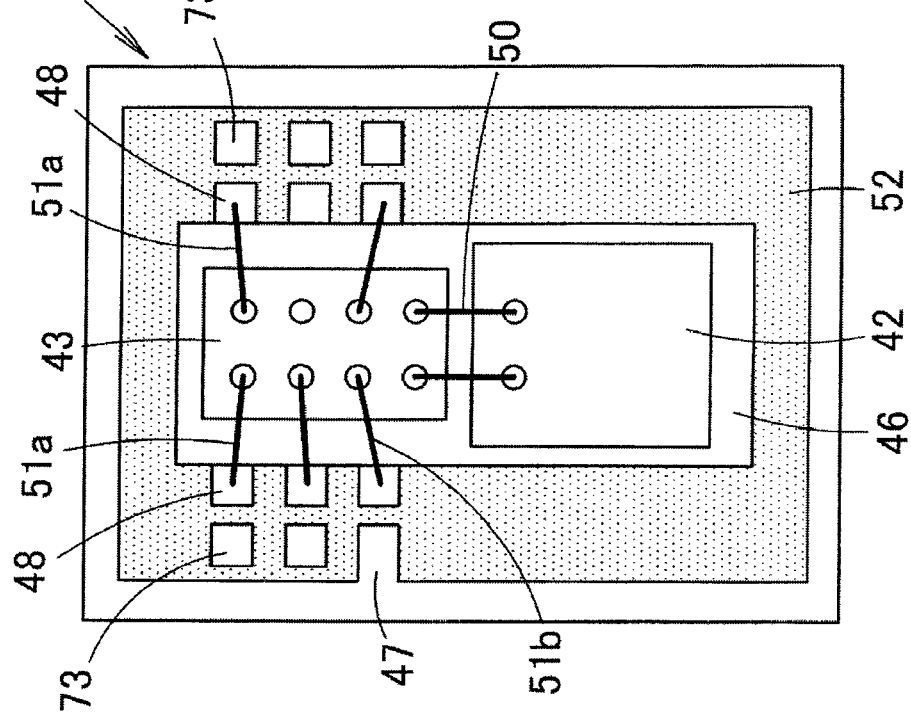

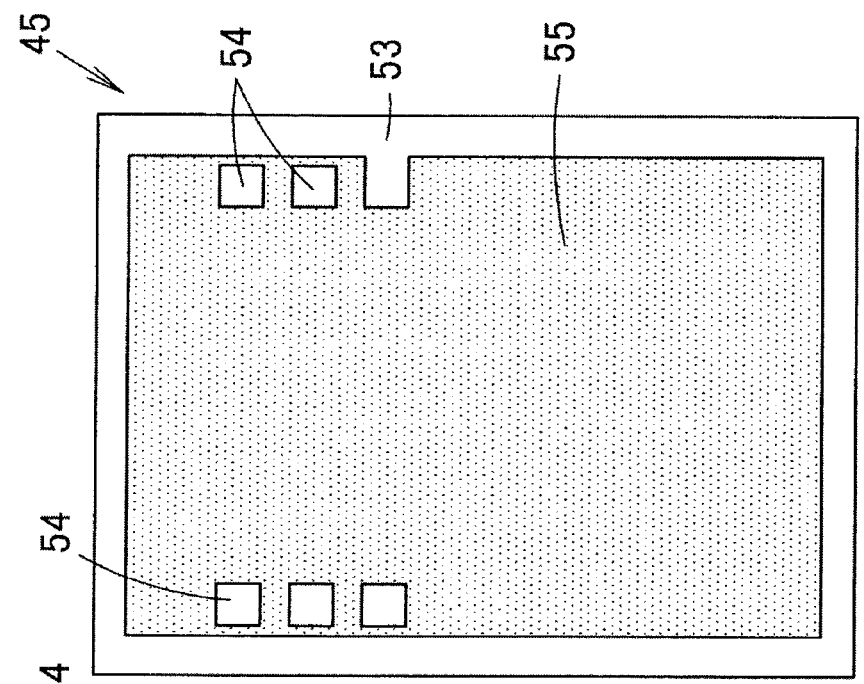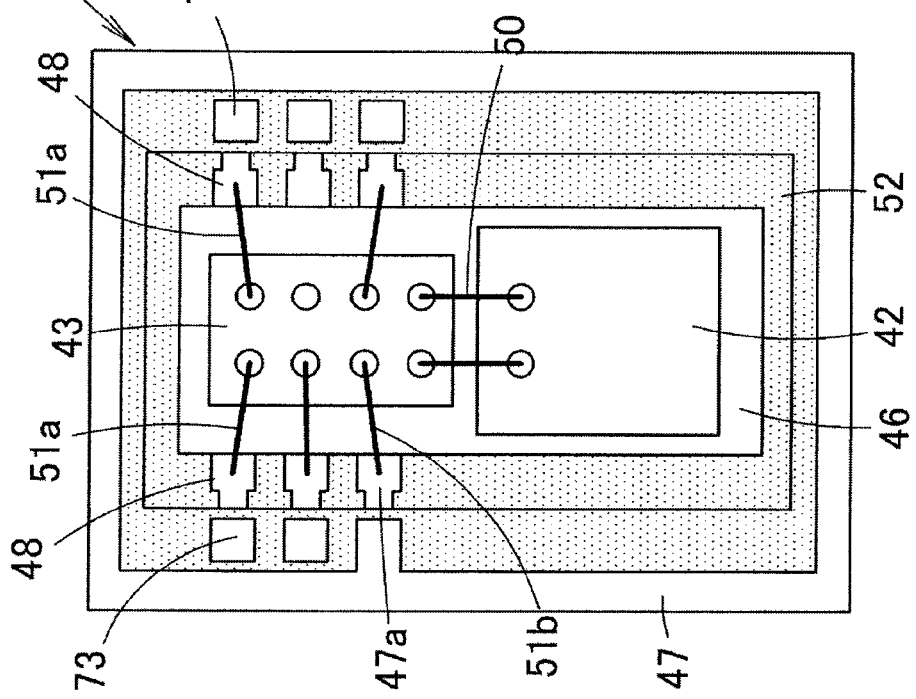

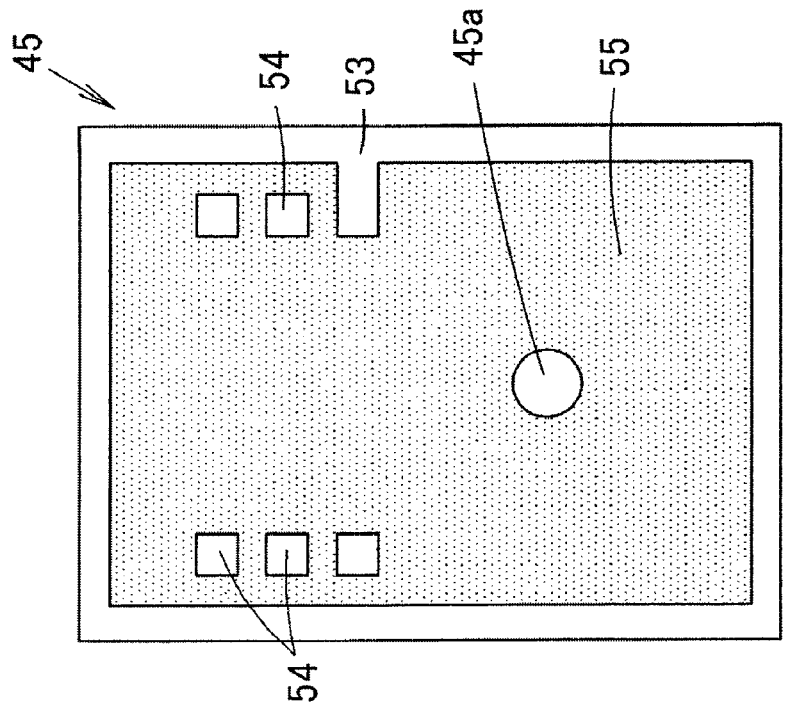
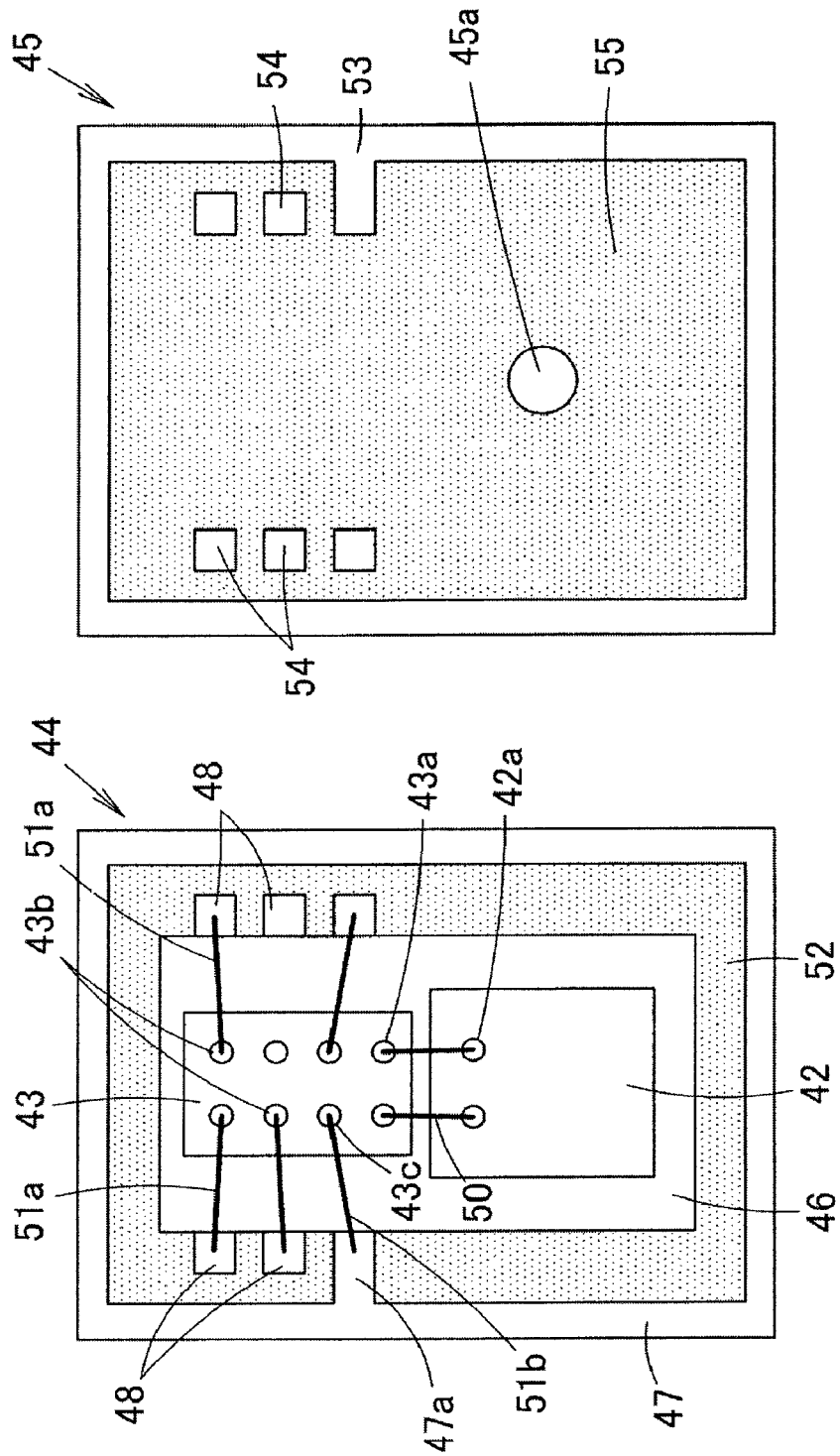

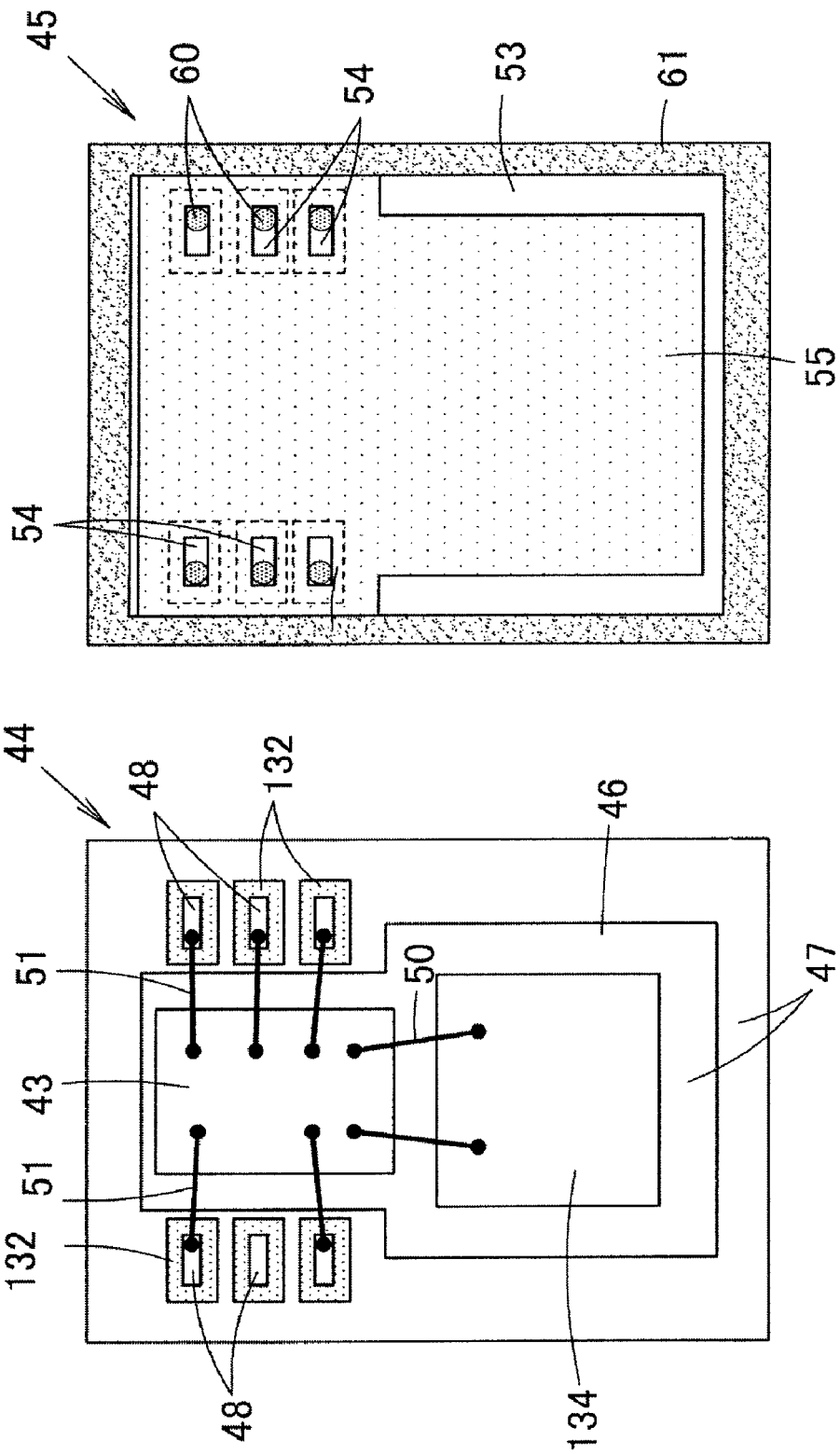

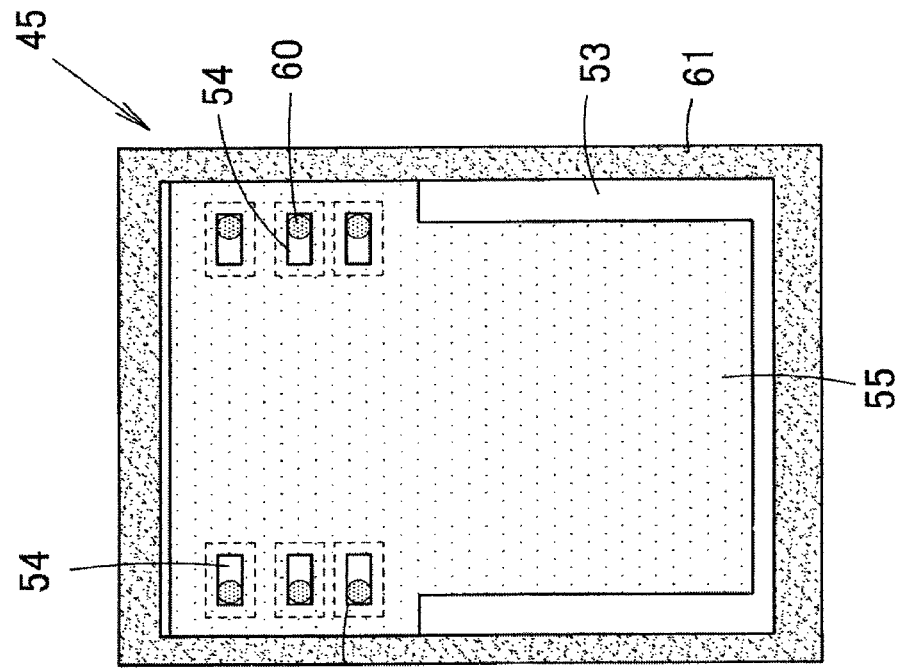
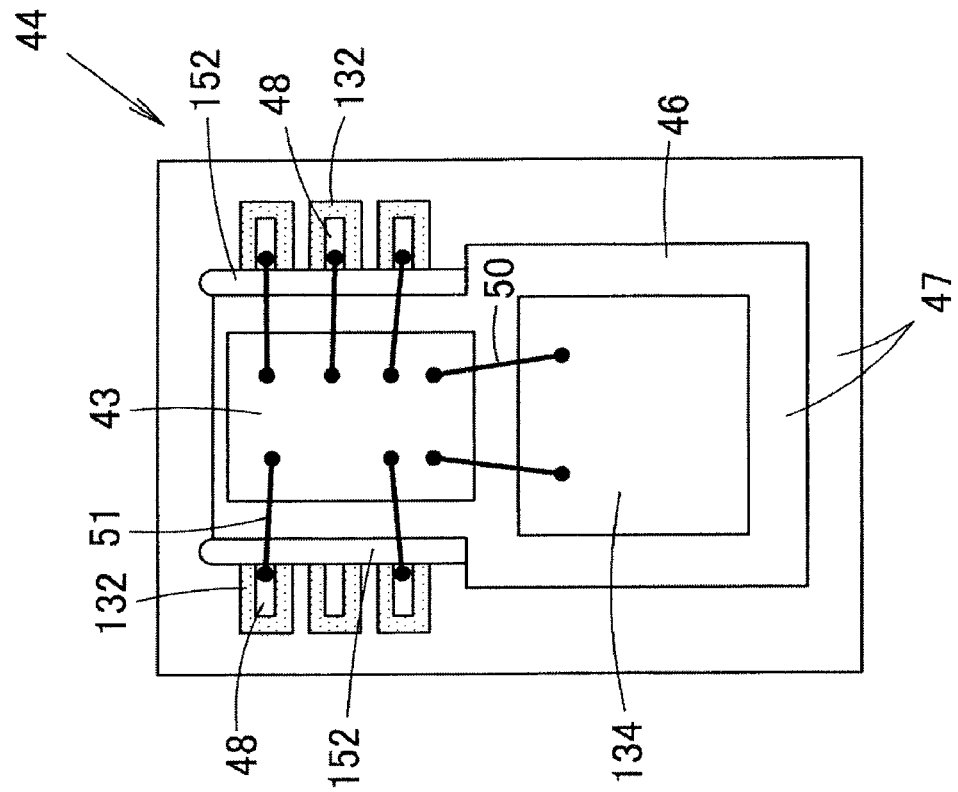

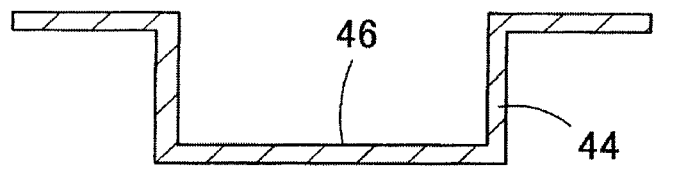
FIG. 32A
FIG. 32B
FIG. 32C
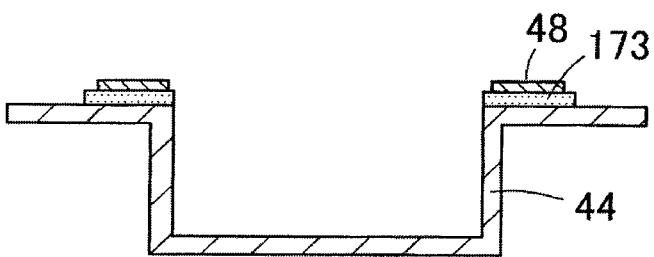
FIG. 32D
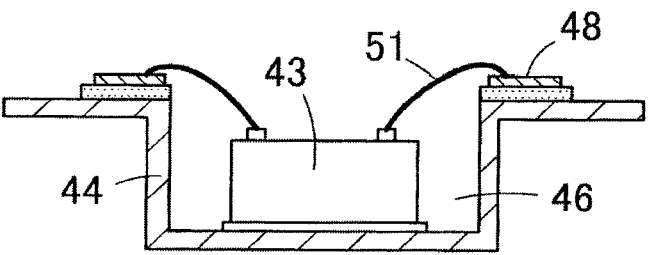
FIG. 32E
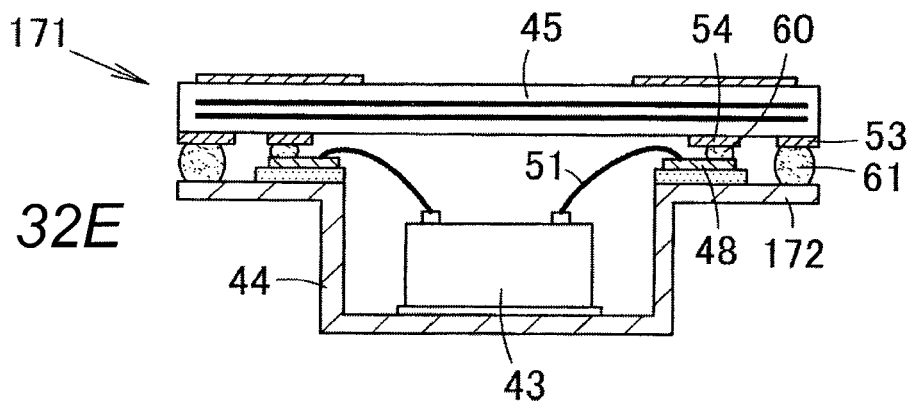

SEMICONDUCTOR DEVICE AND MICROPHONE

BACKGROUND OF THE INVENTION

1. Technical Field

One or more embodiments of the present invention relates to semiconductor devices and microphones. Specifically, one or more embodiments of the present invention relate to a semiconductor device in which a semiconductor element is accommodated in a package. One or more embodiments of the present invention also relates to a microphone in which a microphone chip (acoustic sensor) is accommodated in a package.

2. Related Art

A microphone manufactured using the MEMS (Micro Electro-Mechanical Systems) technique generally has a structure in which an MEMS microphone chip is accommodated in a package configured by a substrate and a cover. The microphone includes that in which the microphone chip is mounted on the cover and that in which the microphone chip is mounted on the substrate. An acoustic hole for introducing the acoustic vibration into the package may be opened in the cover or may be opened in the substrate.

The microphone has a characteristic in that the sensitivity becomes higher as the capacity of the back chamber (space on the side opposite to the acoustic hole with respect to the diaphragm) becomes larger. Thus, if the acoustic hole is formed in the cover, the microphone chip may be mounted on the inner surface of the cover so as to cover the acoustic hole in terms of increasing the sensitivity of the microphone.

If the acoustic hole is formed in the substrate, the capacity of the back chamber can be increased by mounting the microphone chip on the substrate so as to cover the acoustic hole. However, if the microphone chip is mounted on the substrate so as to cover the acoustic hole of the substrate, drawbacks such as contamination of the microphone chip, sticking of the microphone chip to the diaphragm, and the like may occur due to the soldering fume that occurs when mounting the substrate of the micro-phone to the circuit substrate of the device. The microphone chip is thus sometimes mounted on the cover even if the acoustic hole is formed in the substrate.

The microphone in which the microphone chip is mounted on the cover is disclosed in US 2008/0283988 A1. FIG. 1 is a cross-sectional view of a microphone disclosed in US 2008/0283988 A1. In a microphone 11 described in US 2008/0283988 A1, a microphone chip 13 (MEMS microphone) and an IC chip 14 are mounted in a recess provided in a cover 12. The microphone chip 13 is arranged to cover an acoustic hole 20 formed in the cover 12. An input/output wiring 17, which is a signal input/output unit, is formed on the substrate 16, and a connection electrode 18 electrically conducted with the input/output wiring 17 is arranged on the upper surface of the substrate 16. The cover 12 is fixed to the upper surface of the substrate 16, and the microphone chip 13 and the IC chip 14 are accommodated in a package including the cover 12 and the substrate 16.

In such microphone 11, the microphone chip 13 and the IC chip 14 are connected by a bonding wire 15a. A plurality of internal conductor wirings 19 is arranged on the inner surface of the cover 12 from the upper surface (top surface) to the lower end at the side surface, where the microphone chip 13 is connected to a bonding pad 19a at the end of the internal conductor wiring 19 by a bonding wire 15b and the IC chip 14 is also connected to the bonding pad 19a at the end of the internal conductor wiring 19 by a bonding wire 15c. The microphone chip 13 and the IC chip 14 are electrically conducted to the input/output wiring 17 by contacting each internal conductor wiring 19 to the connection electrode 18 of the substrate 16 when attaching the cover 12 to the upper surface of the substrate 16.

However, in the microphone 11 of US 2008/0283988 A1, the internal conductor wiring 19 needs to be arranged in the recess from the upper surface thereof to the lower end at the side surface, and hence the processing of the internal conductor wiring 19 is troublesome. When mounting the microphone chip to the cover such as in the above case, the wiring for connecting the microphone chip to the substrate becomes complex, the manufacturing cost of the microphone becomes high, and the reliability lowers.

In the structure of the microphone 11, wire bonding needs to be carried out on the bonding pad 19a within the recess depressed to a box shape of the cover 12, and hence a space for the jig (capillary) for wire bonding to enter is required at the edge of the recess. A redundant space is thus necessary in the recess, which enlarges the package.

In a microphone 21 (condenser microphone) disclosed in US 2007/0058826 A1, the package is divided into three members, a cover 22, a side substrate 29, and a substrate 28. A microphone chip 23 (microphone element) and an IC chip 24 are mounted on the cover 22, and the microphone chip 23 is arranged to cover an acoustic hole 22a of the cover 22. The microphone chip 23 and the IC chip 24 are connected by a bonding wire 26a, and a bonding pad 25 arranged on the cover 22 and the microphone chip 23, and the IC chip 24 are electrically connected by bonding wires 26b, 26c, respectively. An external connection terminal 27, which is a signal input/output unit, is arranged on the upper surface of the substrate 28, a connection electrode 33 is arranged on the lower surface of the substrate 28, and the external connection terminal 27 and the connection electrode 33 are connected by a through-hole 32. The periphery of a space between the cover 22 and the substrate 28 is surrounded by the side substrate 29. The side substrate 29 is sandwiched between the cover 22 and the substrate 28, and an upper end and a lower end of the through-hole 30 and a coil spring 31 are respectively pressure welded to the connection electrode 33 and the bonding pad 25 to electrically conduct the bonding pad 25 to the external connection terminal 27.

In the microphone 21 having such structure, the microphone chip 23 and the IC chip 24 are mounted on the cover 22, the microphone chip 23 and the IC chip 24 are wire bonded to the bonding pad 25, and then the side substrate 29 and the substrate 28 are overlapped on the cover 22 to electrically conduct the bonding pad 25 and the external connection terminal 27. Therefore, the wire bonding work can be easily carried out without being inhibited by the side substrate 29, and the space inside the package can be made small.

In the structure described in US 2007/0058826 A1, however, the number of members configuring the package increases, and the package structure becomes complex and the cost of the microphone 21 becomes high as the structure of the through-hole 30 and the coil spring 31 need to be formed in the side substrate 29. Furthermore, the outer size of the package cannot be reduced because the wall thickness of the side substrate 29 cannot be reduced even if the space in the package does not become large.

SUMMARY OF INVENTION

Therefore, in the microphone of the prior art in which the member (cover) mounted with the microphone chip and the member (substrate) including the signal input/output unit of the microphone are separate members, the structure of the package or the wiring structure is complicated because the bonding pad is arranged on the same surface as the surface mounted with the semiconductor device.

One or more embodiments of the present invention may simplify the structure of a semiconductor device (microphone) having a package structure in which the member for mounting the semiconductor element (microphone chip) and the member including the signal input/output unit are separate members.

In accordance with one aspect of one or more embodiments of the present invention, a semiconductor device includes a first member and a second member configuring a package; a semiconductor element mounted on the first member by being accommodated in a recess formed in the first member; a connection unit for electrically connecting an area outside a mounting surface of the semiconductor element of the first member and the semiconductor element; and a conduction unit for electrically connecting the first member and the second member.

In the semiconductor device of one or more embodiments of the present invention, the semiconductor element mounted on the first member and the first member can be connected with an electrical connecting unit and the semiconductor element can be easily connected to the second member by simply joining the first member and the second member because the area outside a mounting surface of the semiconductor element of the first member and the semiconductor element are electrically connected by the electrical connecting unit, and the first member and the second member are electrically connected with the conduction unit. Thus, the wiring structure in the package of the semiconductor device can be simplified, and the cost of the semiconductor device can be lowered.

In one embodiment of the semiconductor device according to one or more embodiments of the present invention, the semiconductor device further includes a signal input/output unit arranged on the second member; a bonding pad arranged at an outer edge of the recess of the first member; and a second joint portion conducted with the signal input/output unit arranged in the second member; wherein the connection unit is a wire wiring for connecting the semiconductor element and the bonding pad; and the conduction unit electrically conducts the bonding pad and the second joint portion. The outer edge of the recess of the first member means the outside of the recess or in the vicinity of an opening of the recess of the first member.

In such embodiment, the bonding pad is arranged at the outer edge of the recess of the first member, and thus the semiconductor element can be easily connected to the second member by simply connecting the semiconductor element mounted on the first member and the bonding wire with the wire wiring, and conducting the bonding pad of the first member and the second joint portion of the second member with the conduction unit. Therefore, the wiring structure in the package of the semiconductor device can be simplified, and the cost of the semiconductor device can be lowered. Furthermore, a jig for wire bonding does not need to be inserted into the recess because the bonding pad is arranged at the outer edge of the recess of the first member, and hence the area of the recess can be reduced and the package can be made compact.

In another embodiment of the semiconductor device according to one or more embodiments of the present invention, the second member has a depression in a surface facing the recess. According to such embodiment, the wire wiring connected to the bonding pad is less likely to contact the second member and the short circuit by the wire wiring can be prevented because the space in the package becomes high.

In another embodiment of the semiconductor device according to one or more embodiments of the present invention, the semiconductor device further includes a first joint portion arranged on a surface facing the second member of the first member and conducted with the bonding pad; wherein the conduction unit connects the first joint portion and the second joint portion. According to such embodiment, the connecting portion of the wire wiring can be avoided from being influenced by the conduction unit because the conduction unit is applied to a position different from the bonding pad to which the wire wiring is connected.

In another embodiment of the semiconductor device according to one or more embodiments of the present invention, the bonding pad and the first joint portion may be arranged on surfaces facing the same direction of the first member. For instance, the bonding pad and the first joint portion may be arranged on the same horizontal surface or may be arranged on the same inclined surface.

In another embodiment of the semiconductor device according to one or more embodiments of the present invention, the bonding pad and the first joint portion may be arranged on surfaces facing different directions of the first member. For instance, the bonding pad and the first joint portion may be arranged on the curved surface that is curved. Alternatively, one may be arranged on the horizontal surface and the other may be arranged on the inclined surface.

In another embodiment of the semiconductor device according to one or more embodiments of the present invention, the bonding pad and the first joint portion are positioned in a same plane parallel to a bottom surface of the recess. According to such embodiment, the process of wire bonding is facilitated because the direction of wire bonding at the bonding pad and the direction of wire bonding with respect to the semiconductor element mounted on the bottom surface of the recess are the same direction. The assembly accuracy of the semiconductor device is also enhanced. For instance, the image recognition of the bonding pad and the first joint portion is facilitated.

In another embodiment of the semiconductor according to one or more embodiments of the present invention, the bonding pad and the first joint portion are positioned in different planes parallel to the bottom surface of the recess. According to such embodiment, the process of wire bonding is facilitated because the direction of wire bonding at the bonding pad and the direction of wire bonding with respect to the semiconductor element mounted on the bottom surface of the recess are the same direction. Further, the wire wiring is less likely to contact the second member because the bonding pad is slightly spaced apart from the second member.

In another embodiment of the semiconductor device according to one or more embodiments of the present invention, an outer peripheral edge of the first joint portion is higher than a region on the inner side. According to such embodiment, the conduction unit is less likely to leak outside from the first joint portion even if the conduction unit is a solder or a conductive adhesive.

The material of the first member in the semiconductor device of one or more embodiments of the present invention may be at least one material selected from a group consisting of copper-clad laminate, glass epoxy, ceramic, plastic, metal, and carbon nanotube or a complex material thereof. Similarly, the material of the second member may be at least one material from a group consisting of copper-clad laminate, glass epoxy, ceramic, plastic, metal, and carbon nanotube or a complex material thereof. Furthermore, the first member and the second member may have an electromagnetic shield function for shielding external electromagnetic noise.

The conduction unit consisting of at least one of a solder, a conductive resin, a conductive tape, or a wax material is desirably used to join the first joint portion of the first member and the second joint portion of the second member. The mechanical joining and the electrical joining of the first member and the second member can be simultaneously carried out by using such conduction unit. When desiring to enhance the joining strength and the sealability of the first member and the second member, the non-conductive resin or the non-conductive tape may be simultaneously used.

The semiconductor device according to one or more embodiments of the present invention may accommodate two or more semiconductor elements. For instance, a sensor and a circuit element may be arranged as the semiconductor element; the other end of the wire wiring, which has one end connected to the circuit element or the sensor, may be connected to one of the bonding pads, and the other end of another wire wiring, which has one end connected to the circuit element or the sensor, may be connected to a different one of the bonding pads.

In accordance with another aspect of one or more embodiments of the present invention, the semiconductor device can be applied to a microphone. For instance, in a microphone in which the sensor is a microphone chip, the first member is a cover of the package, and the second member is a substrate of the package, an acoustic hole may be opened in the cover and the microphone chip may be attached to the cover to cover the acoustic hole. Such microphone is a top port type microphone, and thus the capacity of the back chamber can be increased and higher sensitivity of the microphone can be realized. Alternatively, in a microphone in which the sensor is a microphone chip, the first member is a cover of the package, and the second member is a substrate of the package, an acoustic hole may be opened in the substrate. In such a case, the microphone is a bottom port type microphone, but the microphone chip can be prevented from being polluted by the solder fume that entered from the acoustic hole and the diaphragm of the microphone chip can be prevented from causing sticking because the microphone chip is arranged in the cover.

The means of one or more embodiments of the invention may appropriately combine the configuring elements described above, and the one or more embodiments of the present invention may enable a great number of variations from the combinations of the configuring elements.

BRIEF DESCRIPTION OF THE DRAWINGS

FIGS. 5A and 5B are a plan view of a cover and a plan view of a substrate used in the microphone of the first embodiment, FIG. 5C is a plan view showing one part of a variant of the first embodiment, and FIG. 5D is a plan view showing one part of another variant of the first embodiment;

FIGS. 10A and 10B are a plan view of a cover and a plan view of a substrate used in the microphone of the third embodiment;

FIGS. 13A and 13B are a plan view of a cover and a plan view of a substrate used in the microphone of the fourth embodiment;

FIGS. 21A and 21B are a plan view of a cover and a plan view of a substrate used in the microphone of the seventh embodiment;

FIGS. 23A and 23B are a plan view of a cover and a plan view of a substrate used in the microphone of the eighth embodiment;

FIGS. 28A and 28B are a plan view of a cover and a plan view of a substrate used in the semiconductor device of the ninth embodiment;

FIGS. 32A to 32E are schematic cross-sectional views showing the manufacturing process of a semiconductor device according to an eleventh embodiment according to the present invention.

DETAILED DESCRIPTION

Hereinafter, embodiments of the present invention will be described with reference to the accompanied drawings. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

First Embodiment

Figure 1:
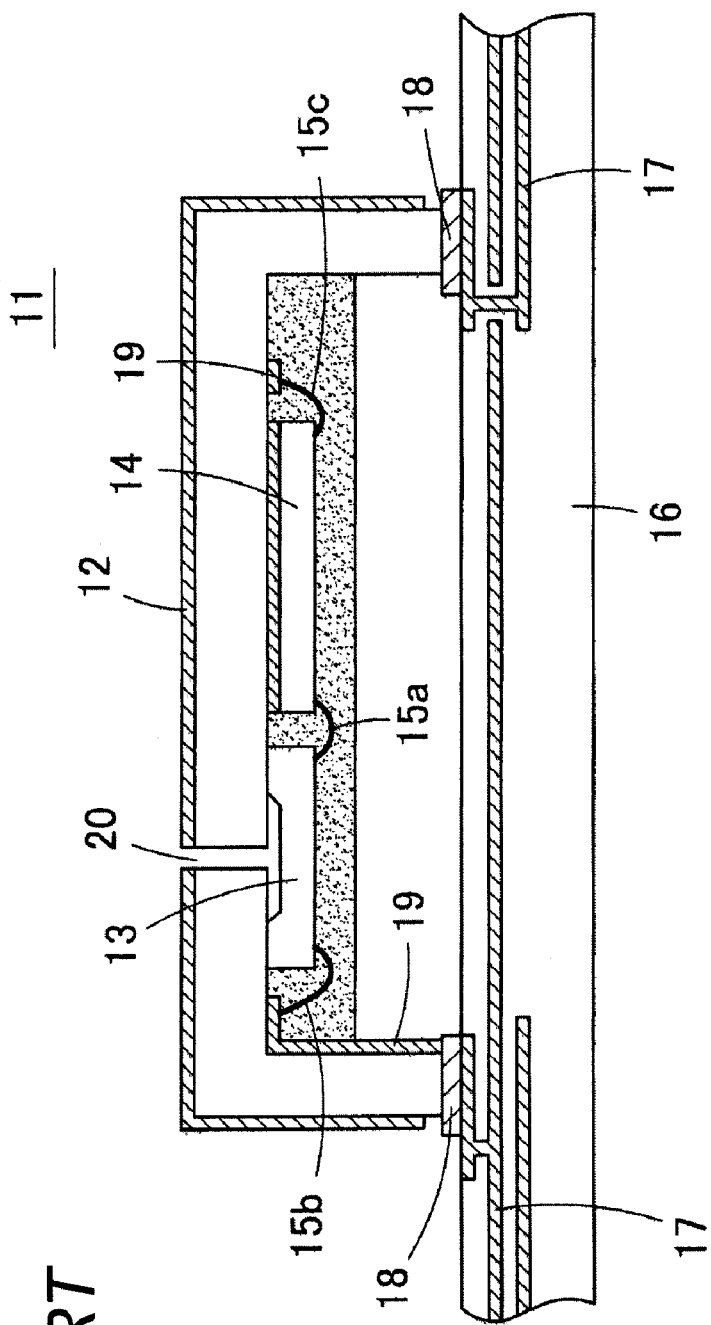
FIG. 1 is a cross-sectional view of a microphone disclosed in US 2008/0283988 A1.
Figure 2:
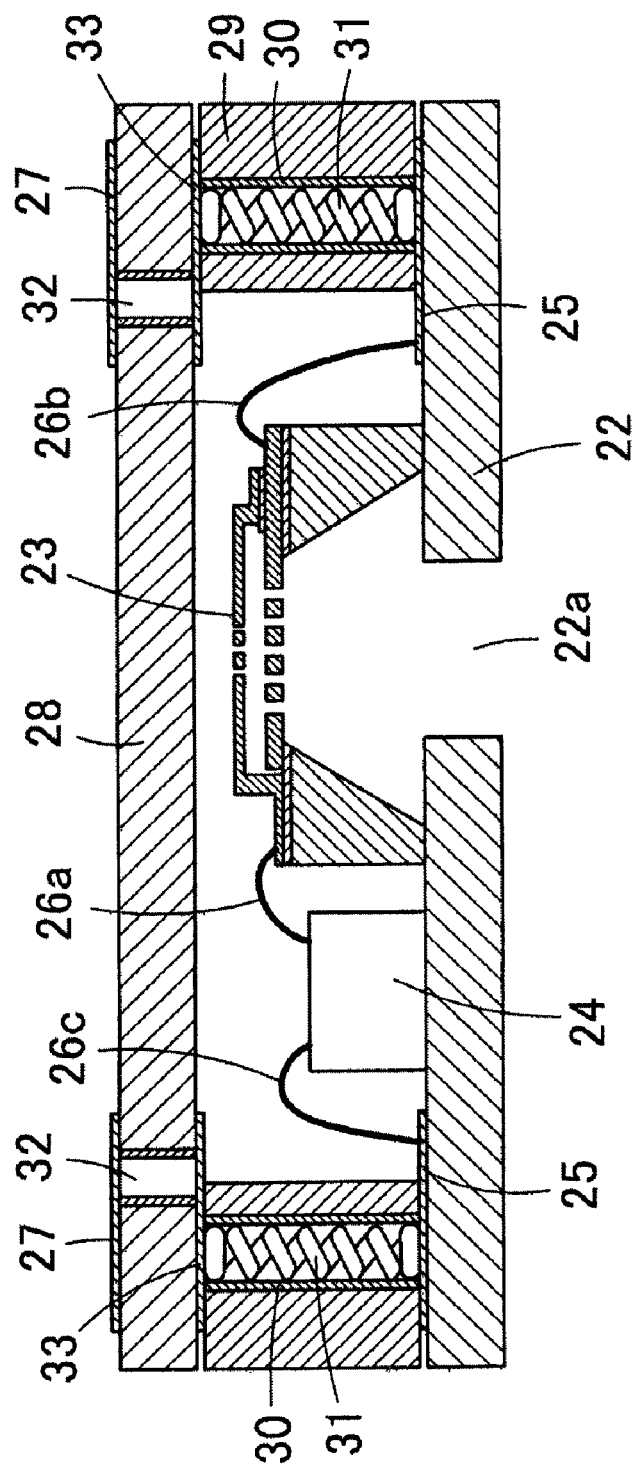
FIG. 2 is a cross-sectional view of a microphone disclosed in US 2007/0058826 A1.
Figure 3:
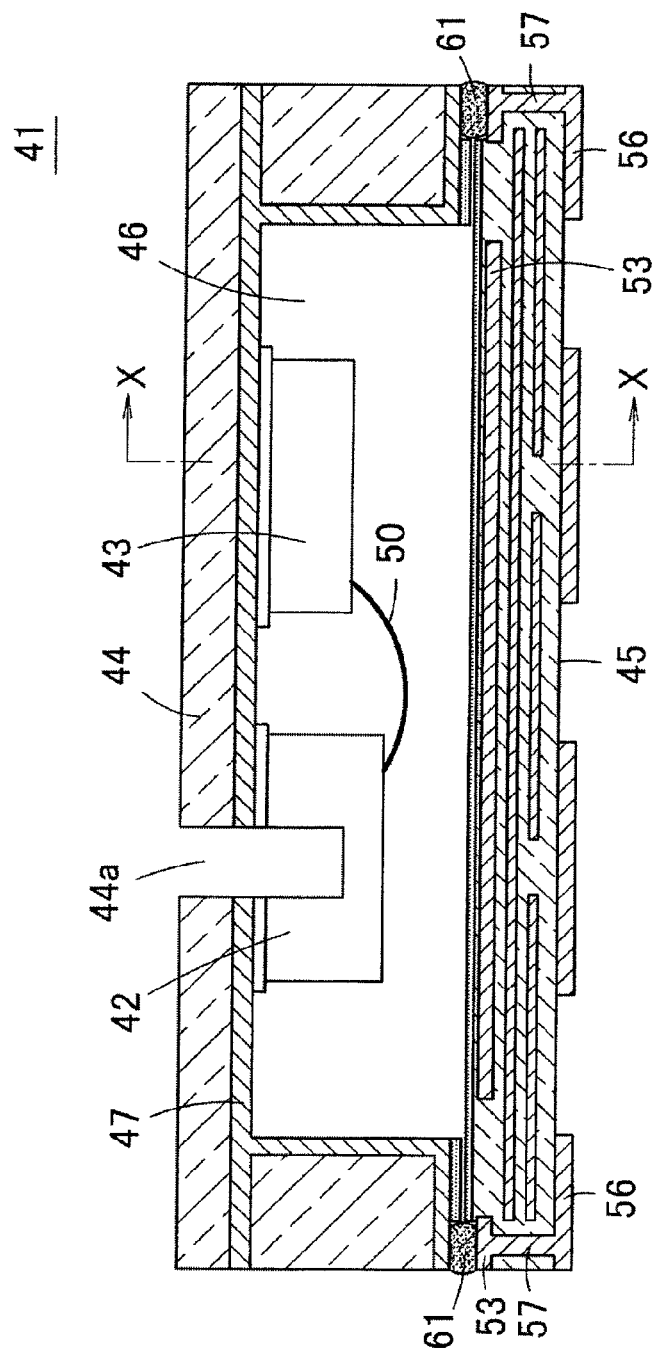
FIG. 3 is a cross-sectional view taken along a longitudinal direction of a microphone according to a first embodiment of the present invention.
Figure 4:
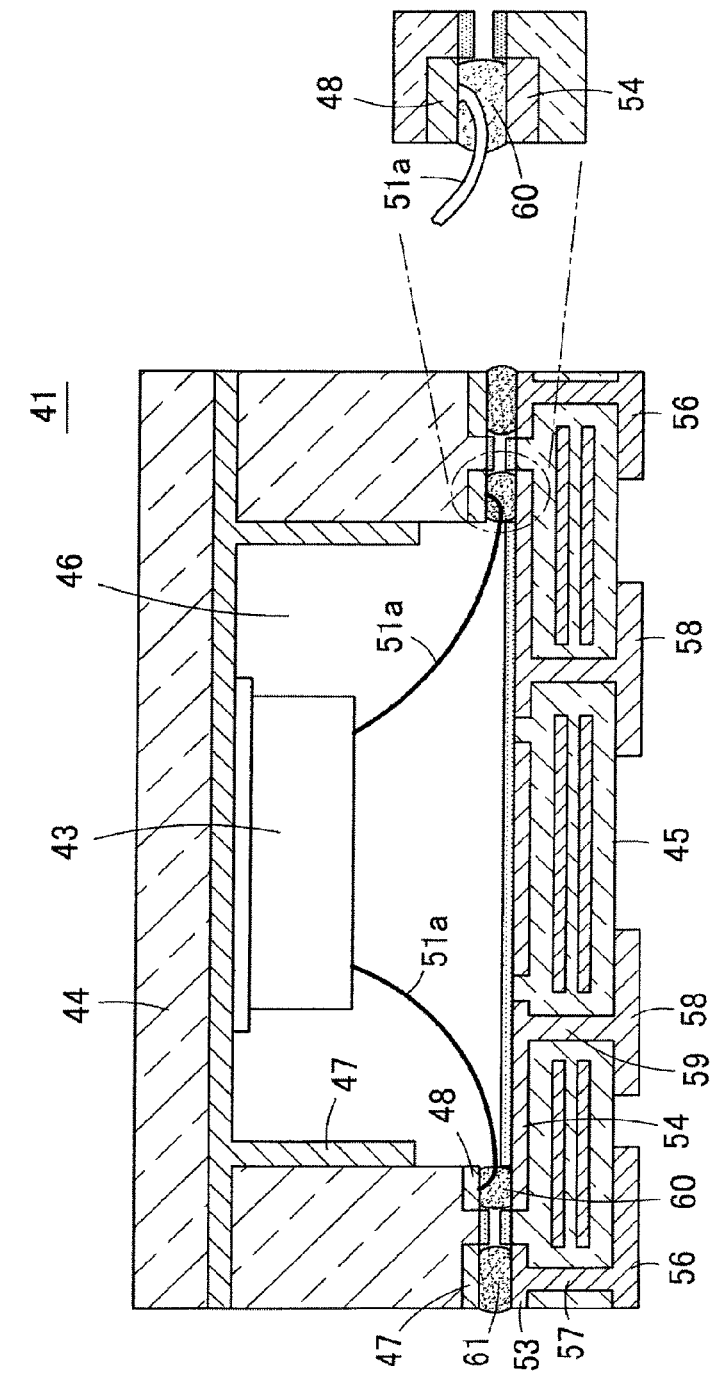
FIG. 4 is a cross-sectional view along a width direction of the microphone of the first embodiment (cross-sectional view taken along line X-X of FIG. 3)

A top port type microphone 41 according to a first embodiment of the present invention will be described below with reference to FIG. 3, FIG. 4, and FIG. 5. FIG. 3 is a cross-sectional view showing a cross-section taken along a longitudinal direction of the microphone 41. FIG. 4 is a cross-sectional view showing a cross-section in a width direction taken along line X-X of FIG. 3. The microphone 41 is an MEMS microphone manufactured using the MEMS technique.

The microphone 41 has a microphone chip 42 and a circuit element 43 accommodated in a package including a cover 44 and a substrate 45. FIG. 5A is a bottom view of the cover 44 (first member) mounted with the microphone chip 42 and the circuit element 43, and FIG. 5B is a top view of the substrate 45 (second member). FIG. 5A also shows a state in which the solder resist of the elliptical portion is removed.

As shown in FIG. 3 and FIG. 4, the cover 44 is formed by laminating two insulating substrates including at least one material of a copper-clad laminate or glass epoxy, ceramic, plastic, and carbon nanotube, or complex material thereof. The cover 44 made from the insulating material includes a box-shaped recess 46 for accommodating the microphone chip 42 and the circuit element 43. An electromagnetic shield conductive layer 47 is formed substantially entirely on the top surface and the side wall surface of the recess 46, and the lower surface of the cover 44 at the exterior of the recess 46. As shown in FIG. 5A, a plurality of bonding pads 48 (also serve as first joint portion) is formed near the recess 46 at the exterior of the recess 46, that is, the lower surface of the cover 44. The conductive layer 47 and the bonding pad 48 are metal films, but the periphery of the bonding pad 48 is separated from the conductive layer 47 and each bonding pad 48 and the conductive layer 47 are insulated from each other.

The microphone chip 42 is an MEMS element (acoustic sensor), and includes a diaphragm of thin film for acoustic vibration sensing at an opening of the Si substrate, for example. The circuit element 43 is an element such as ASIC and IC chip. As shown in FIG. 3, the microphone chip 42 and the circuit element 43 are accommodated in the recess 46, and the respective rear surfaces are fixed to the top surface of the recess 46 by adhesive. The microphone chip 42 is installed in accordance with an acoustic hole 44a formed in the cover 44 to cover the acoustic hole 44a. Thus, the microphone chip 42 can have a wide back chamber capacity as the acoustic hole 44a becomes the front chamber and the space in the recess 46 becomes the back chamber, and higher sensitivity of the microphone chip 42 can be realized.

As shown in FIG. 5A, the terminal 42a arranged on the surface of the microphone chip 42 and the terminal 43a arranged on the surface of the circuit element 43 are connected by the bonding wire 50. One end of the bonding wire 51a (wire wiring) is connected to the terminal 43b arranged on the surface of the circuit element 43, and the other end of the bonding wire 51a is connected to the bonding pad 48. One end of the bonding wire 51b is connected to a ground terminal 43c arranged on the surface of the circuit element 43, and the other end of the bonding wire 51b is connected to a bonding portion 47a of the conductive layer 47 at the lower surface of the cover 44. In FIG. 5A, the microphone chip 42 is not connected to the bonding pad of the cover 44, but the microphone chip 42 may also be wire connected to the bonding pad 48 and the conductive layer 47 of the cover 44 depending on the circuit configuration, and the like. The lower surface of the cover 44 (surface facing the substrate 45) is covered by the solder resist 52 excluding the outer peripheral part of the bonding pad 48 and the conductive layer 47 and the location to connect the bonding wire 51b.

As shown in FIG. 3 and FIG. 4, the substrate 45 includes a multi-layered wiring substrate, a copper-clad laminate, a glass epoxy substrate, a ceramic substrate, a plastic substrate, and a carbon nanotube substrate. A conductive layer 53 for electromagnetic shield and a connection electrode 54 (second joint portion) are arranged on the upper surface of the substrate 45 in a state separated and insulated from each other. The upper surface of the substrate 45 is covered with the solder resist 55, and only one portion of the connection electrode 54 (portion facing the bonding pad 48), and the outer peripheral part and the region facing the bonding portion 47a of the conductive layer 53 are exposed from the solder resist 55.

The ground connection terminal 56 is arranged on the lower surface of the substrate 45, and the ground connection terminal 56 is connected to the conductive layer 53 through a via hole 57. The signal input/output terminal 58 for signal input/output is arranged on the lower surface of the substrate 45, which signal input/output terminal 58 is connected to the connection electrode 54 through a via hole 59.

As shown in FIG. 3 and FIG. 4, the cover 44 is overlapped on the upper surface of the substrate 45 with the recess 46 facing downward, so that the opposing bonding pad 48 and the connection electrode 54 are joined by a conductive member 60. One of a conductive adhesive or solder, a conductive double-sided adhesive tape, a wax material for welding may be used for the conductive member 60, or a plurality of materials of the same may be simultaneously used. The outer peripheral part of the conductive layer 47 exposed from the solder resist 52 and the outer peripheral part of the conductive layer 53 exposed from the solder resist 55 are also joined over the entire periphery or over substantially the entire periphery by a conductive member 61. One of a conductive adhesive or solder, a conductive double-sided adhesive tape, a wax material for welding may be used for the conductive member 61, or a plurality of materials of the same may be simultaneously used. A non-conductive resin or non-conductive tape may be simultaneously used to laminate the cover 44 and the substrate 45. Therefore, the terminal 43b of the circuit element 43 is connected to the signal input/output terminal 58 through the bonding wire 51a, the conductive member 60, the via hole 59, and the like. The ground terminal 43c of the circuit element 43 is connected to the ground connection terminal 56 through the bonding wire 51b, the conductive member 61, the via hole 57, and the like. The conductive layer 47 of the cover 44 is joined to the conductive layer 53 of the substrate 45 by the conductive member 61, and the microphone 41 is blocked from external electromagnetic noise by the conductive layers 47, 53 by connecting the ground connection terminal 56 to the earth line.

According to such microphone 41, the cover 44 can be turned upside down so that the bonding pad 48 is on the top, so that the bonding wires 51a, 51c can be wire bonded to the bonding pad 48 and the bonding portion 47a positioned on the surface of the cover 44. Therefore, the wire bonding does not need to be carried out in the recess 46 as in the case of US 2008/0283988 A1, and the wiring task of the microphone 41 can be easily carried out and the cost of the microphone 41 becomes inexpensive. Furthermore, the area of the recess 46 can be reduced, and the microphone 41 can be miniaturized because the jig for wire bonding does not need to be inserted into the recess 46.

Second Embodiment

Figure 6:
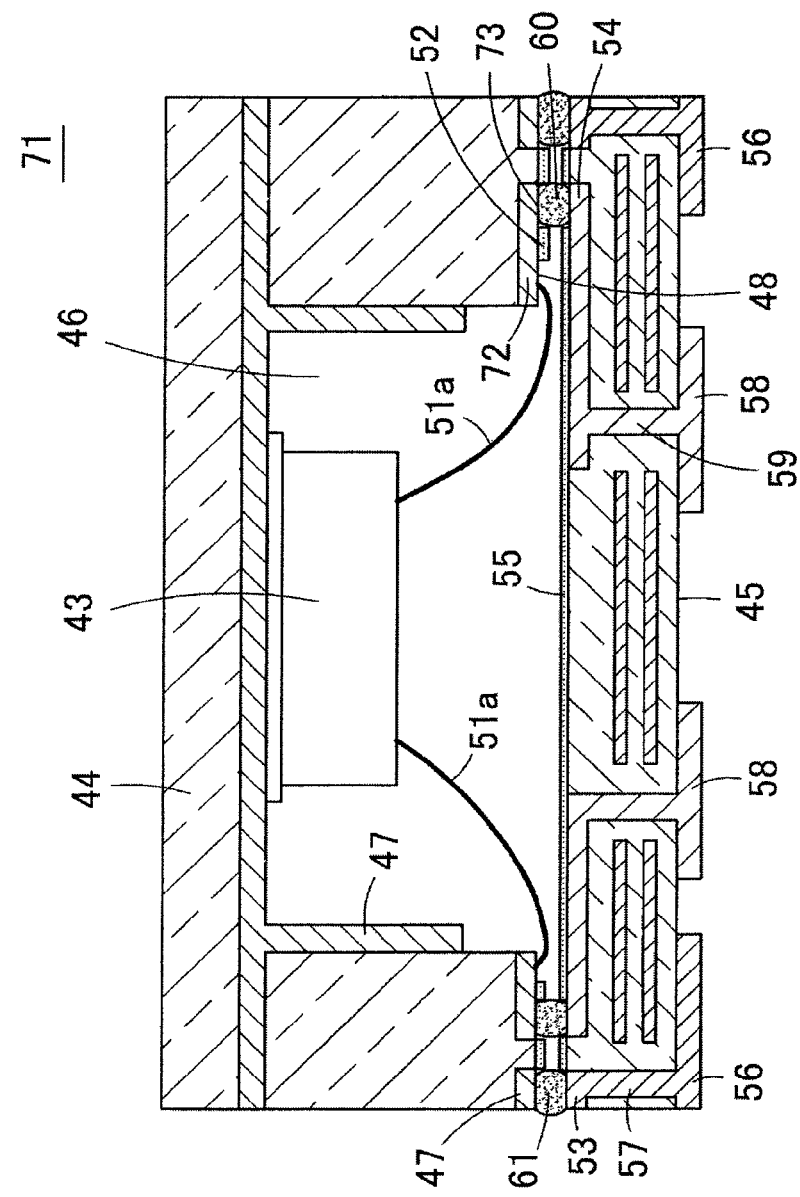
FIG. 6 is a cross-sectional view taken along the width direction of a microphone according to a second embodiment of the present invention.
Figure 7A:
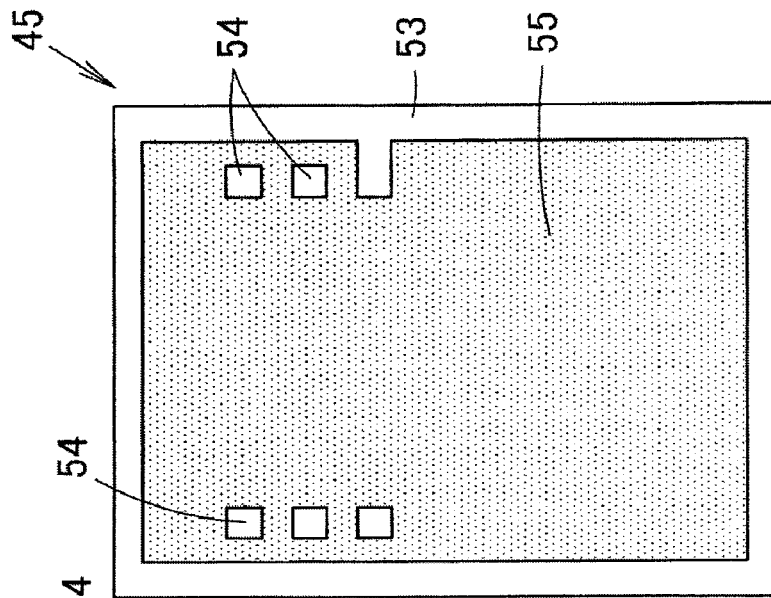
FIGS. 7A and 7B are a plan view of a cover and a plan view of a substrate used in the microphone of the second embodiment.
Figure 7B:
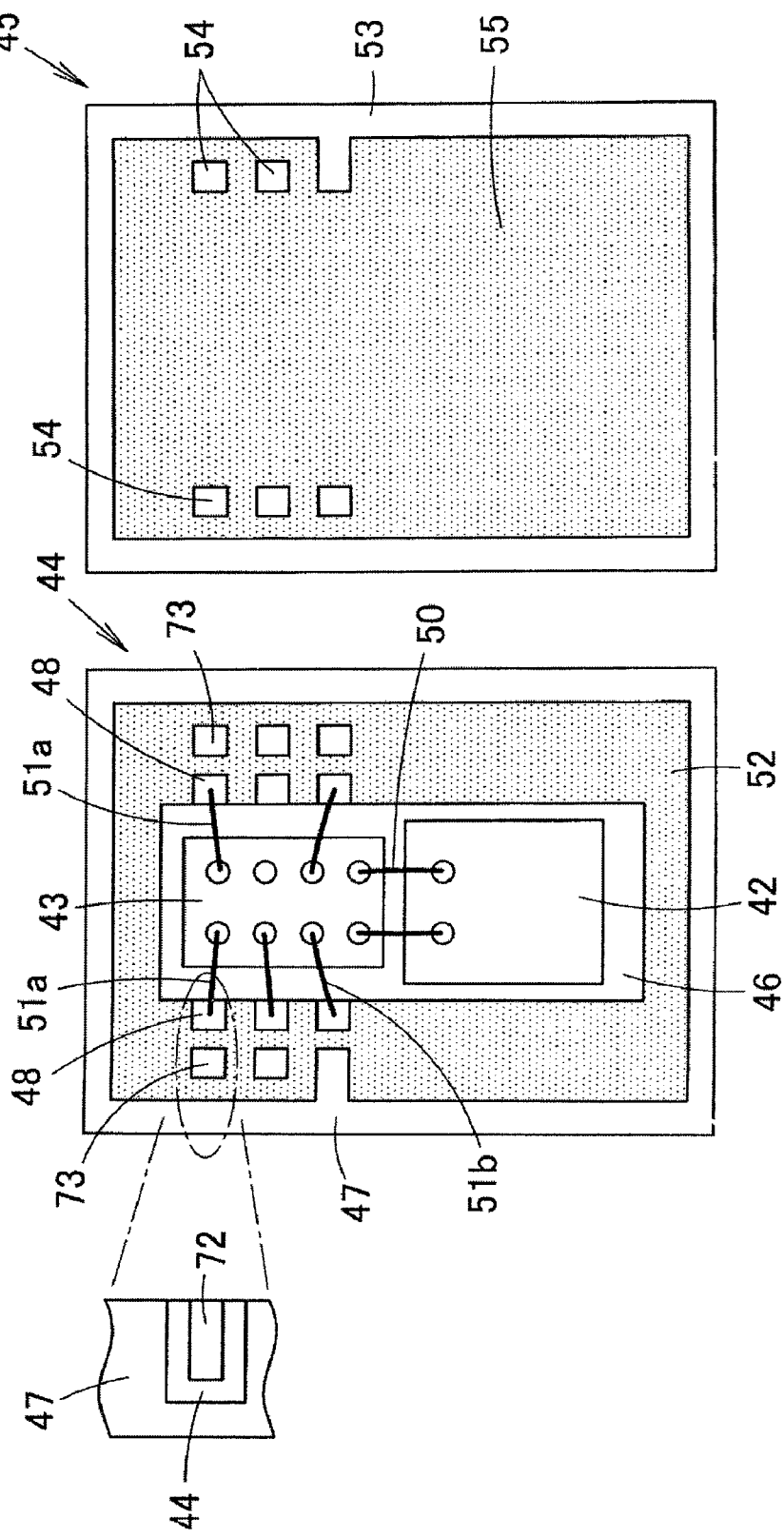

FIG. 6 is a cross-sectional view taken along the width direction of a microphone 71 according to a second embodiment of the present invention. The cross-section taken along the longitudinal direction of the microphone 71 is shown similarly to FIG. 3. FIG. 7A is a bottom view of the cover 44 mounted with the microphone chip 42 and the circuit element 43, and FIG. 7B is a top view of the substrate 45.

In the present embodiment, an electrode plate 72 insulated from the conductive layer 47 is arranged at the lower surface of the cover 44, and the central part of the electrode plate 72 is covered with the solder resist 52 to divide the electrode plate 72 into two regions. One of the regions of the electrode plate 72 divided by the solder resist 52 is the bonding pad 48 for bonding the end of the bonding wire 51a, and the other region of the electrode plate 72 is a joining pad 73 (first joint portion) for joining the connection electrode 54 (second joint portion) with the conductive member 60. The end of the bonding wire 51a is joined to the bonding pad 48, the joining pad 73 is joined to the connection electrode 54 by the conductive member 60, and the bonding wire 51a is conducted to the connection electrode 54 through the electrode plate 72.

When joining the bonding pad 48 joined with the bonding wire 51a by the conductive member 60 as in the first embodiment, an adverse affect may occur in that the joining end of the bonding wire 51a may detach due to heat of the solder or the conductive member 60, or due to curing and contraction of the conductive resin if the bonding wire 51a is a very thin wire. According to the second embodiment, on the other hand, the conducive member 60 is less likely to touch the joining end of the bonding wire 51a, and hence the bonding wire 51a does not detach from the bonding pad 48, and the reliability of the microphone 71 is enhanced.

Third Embodiment

Figure 8:
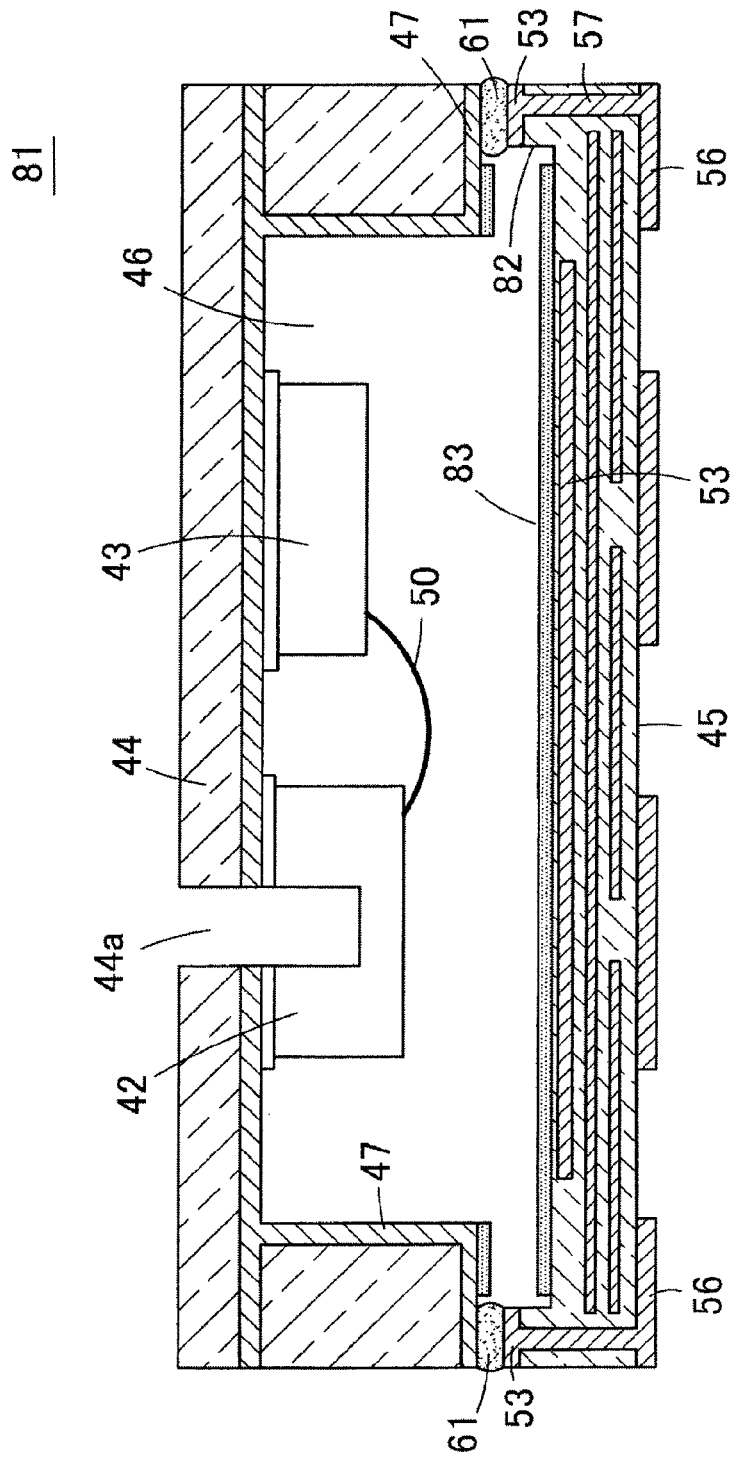
FIG. 8 is a cross-sectional view taken along the longitudinal direction of a microphone according to a third embodiment of the present invention.
Figure 9:
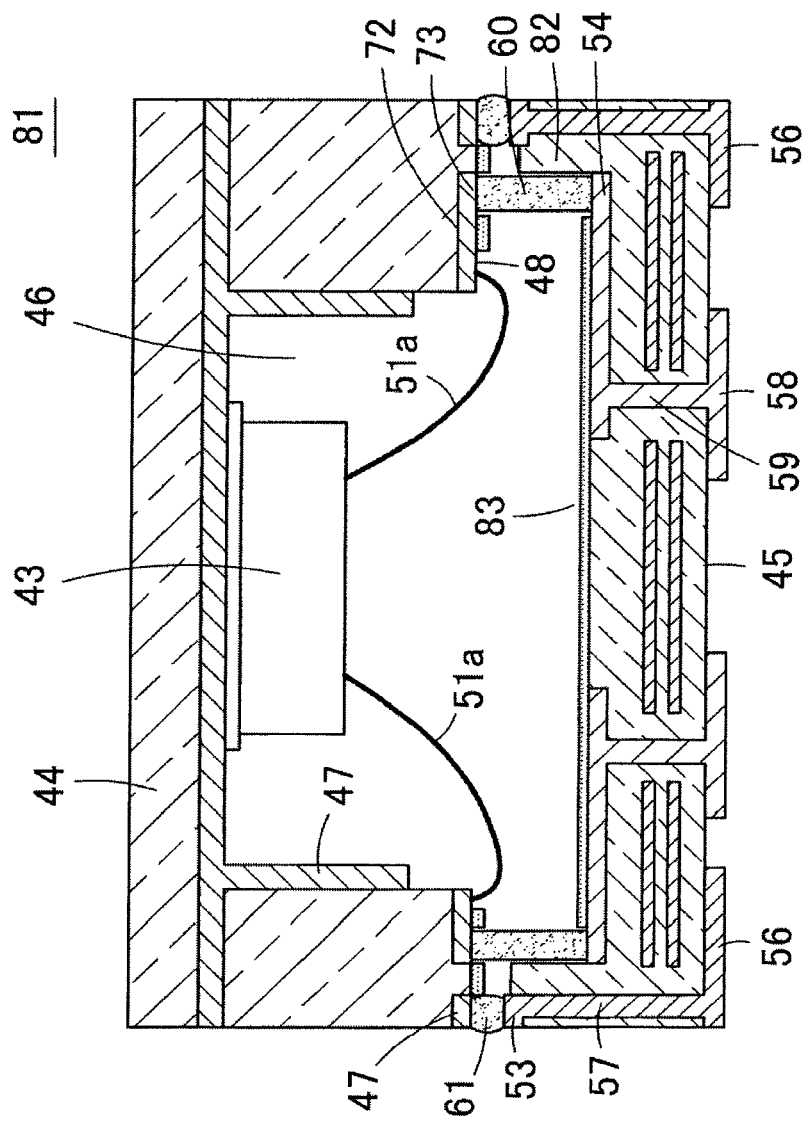
FIG. 9 is a cross-sectional view taken along the width direction of the microphone of the third embodiment.

FIG. 8 is a cross-sectional view taken along the longitudinal direction of a microphone 81 according to a third embodiment of the present invention, and FIG. 9 is a cross-sectional view taken along the width direction of the microphone 81. FIG. 10A is a bottom view of the cover 44 mounted with the microphone chip 42 and the circuit element 43, and FIG. 10B is a top view of the substrate 45.

In the microphone 81, a peripheral wall 82 is raised at the periphery of the upper surface of the substrate 45, and a depression 83 surrounded with the peripheral wall 82 is formed on the upper surface of the substrate 45. The cover 44 is overlapped on the substrate 45 such that the lower surface is mounted on the upper surface of the peripheral wall 82, and the outer peripheral part of the conductive layer 47 is joined to the conductive layer 53 positioned at the outer peripheral part of the upper surface of the peripheral wall 82 by the conductive member 61. Furthermore, the connection electrode 54 is arranged in the depression 83, and is joined to the joining pad 73 by the conductive member 60 applied thickly or heavily.

According to such embodiment, the height of the space (recess 46 and depression 83) inside can be increased without increasing the height of the outer shape of the microphone 81, and hence the space for wiring the bonding wires 50, 51a, 51b becomes wider, and the bonding wires 50, 51a, 51b are less likely to touch the substrate 45 even if hanged down, whereby the reliability of the microphone 81 is enhanced.

Fourth Embodiment

Figure 11:
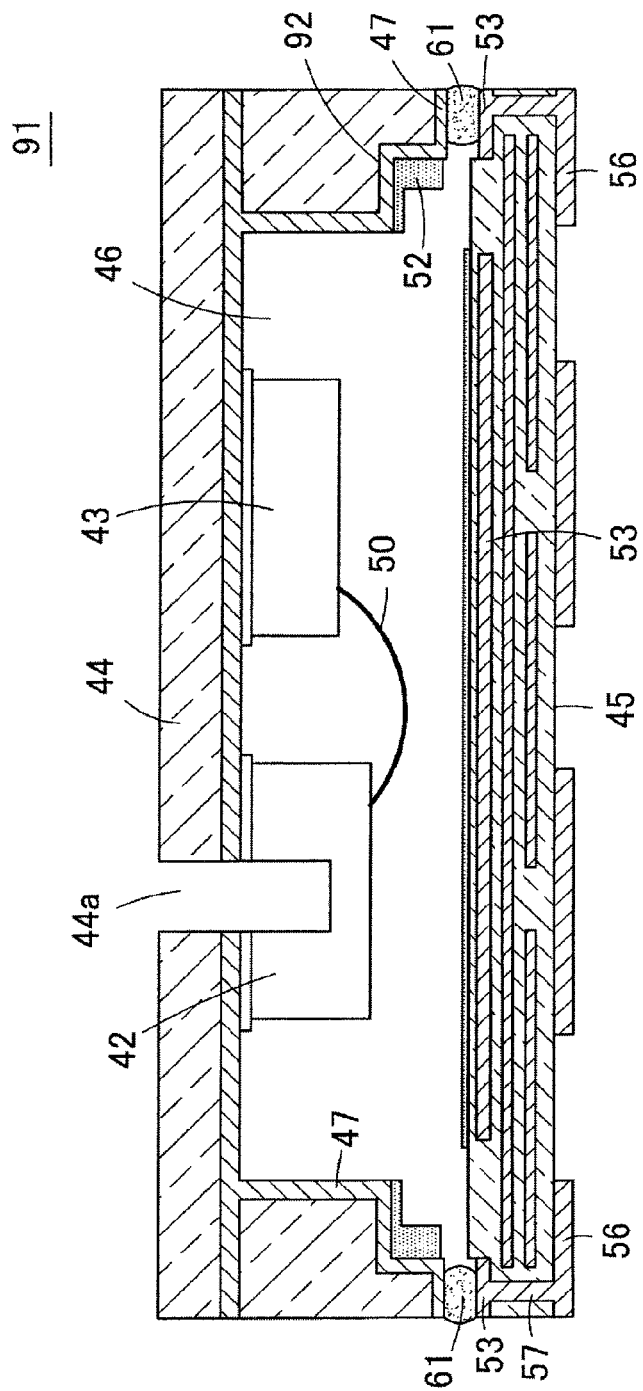
FIG. 11 is a cross-sectional view taken along the longitudinal direction of a microphone according to a fourth embodiment of the present invention.
Figure 12:
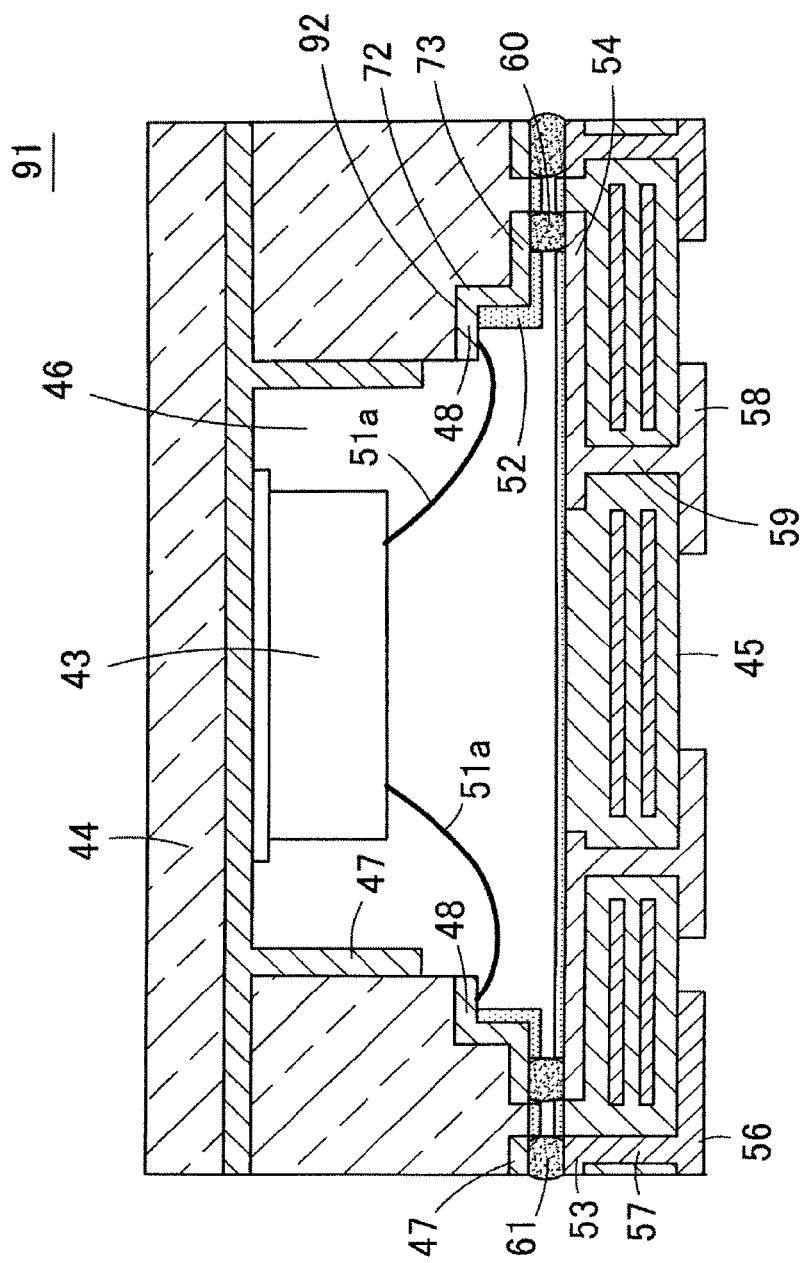
FIG. 12 is a cross-sectional view taken along the width direction of the microphone of the fourth embodiment.

FIG. 11 is a cross-sectional view taken along the longitudinal direction of a microphone 91 according to a fourth embodiment of the present invention, and FIG. 12 is a cross-sectional view taken along the width direction of the microphone 91. FIG. 13A is a bottom view of the cover 44 mounted with the microphone chip 42 and the circuit element 43, and FIG. 13B is a top view of the substrate 45.

The microphone 91 also separately includes the bonding pad 48 and the joining pad 73, and furthermore, a step-down portion 92 is formed near the opening in the recess 46 of the cover 44 in the microphone 91. In other words, the lower end at the side wall surface of the recess 46 is cut at the lower end of the recess 46 (near the lower surface of the cover 44), so that a surface parallel to the lower surface of the cover 44, that is, the step-down portion 92 is formed at a position slightly higher than the lower surface of the cover 44. As shown in FIG. 12, the bent electrode plate 72 is arranged from the step-down portion 92 to the lower surface of the cover 44, and the central part of the electrode plate 72 is covered with 52 to divide into two exposed regions, so that the region exposed from the solder resist 52 in the step-down portion 92 is the bonding pad 48 and the region exposed from the solder resist 52 at the lower surface of the cover 44 is the joining pad 73. The end of the bonding wire 51a is connected to the bonding pad 48 positioned at the step-down portion 92, and the joining pad 73 is joined to the connection electrode 54 of the substrate 45 by the conductive member 60.

The bonding portion 47a for connecting the bonding wire 51b is also arranged at the step-down portion 92.

According to such embodiment, the bonding pad 48 and the bonding portion 47a for connecting the bonding wires 51a, 51b are arranged at the step-down portion 92, so that the bonding wires 51a, 51b can be connected to the bonding pad 48 and the bonding portion 47a at the position slightly away from the substrate. Therefore, the bonding wires 51a, 51b are less likely to touch the substrate 45 even if hanged down, whereby the reliability of the microphone 91 can be enhanced.

Fifth Embodiment

Figure 14:
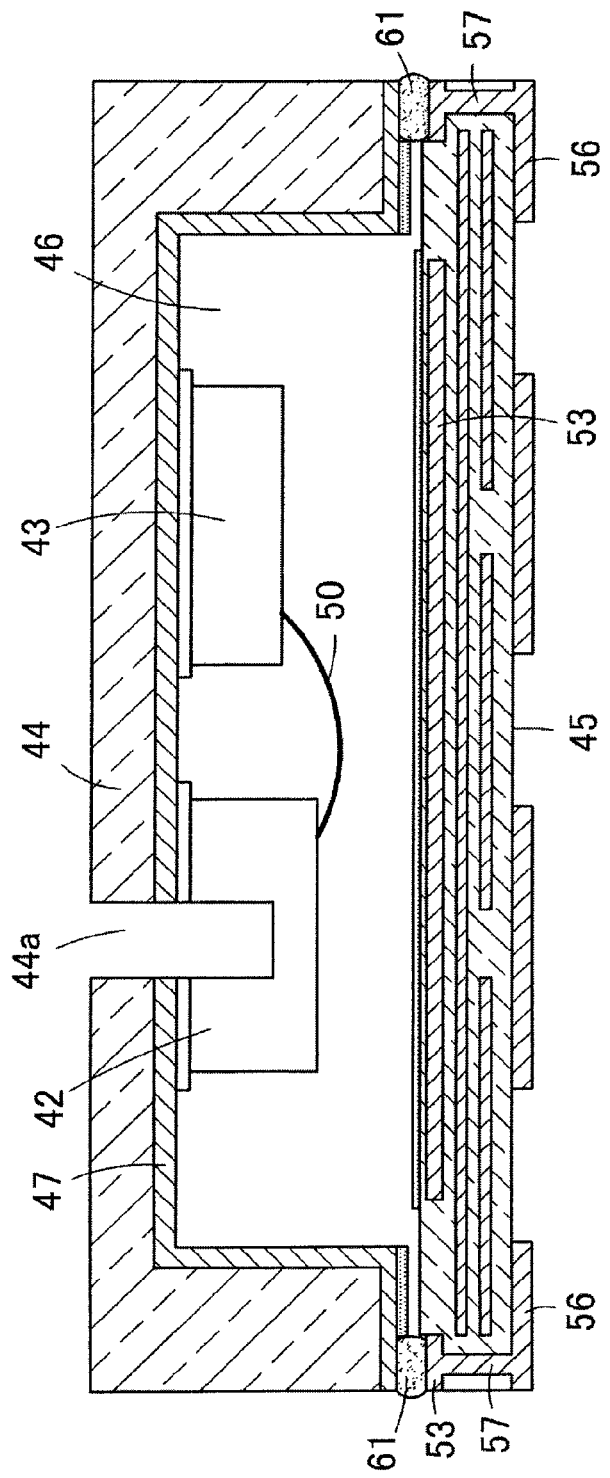
FIG. 14 is a cross-sectional view taken along the longitudinal direction of a microphone according to a fifth embodiment of the present invention.
Figure 15:
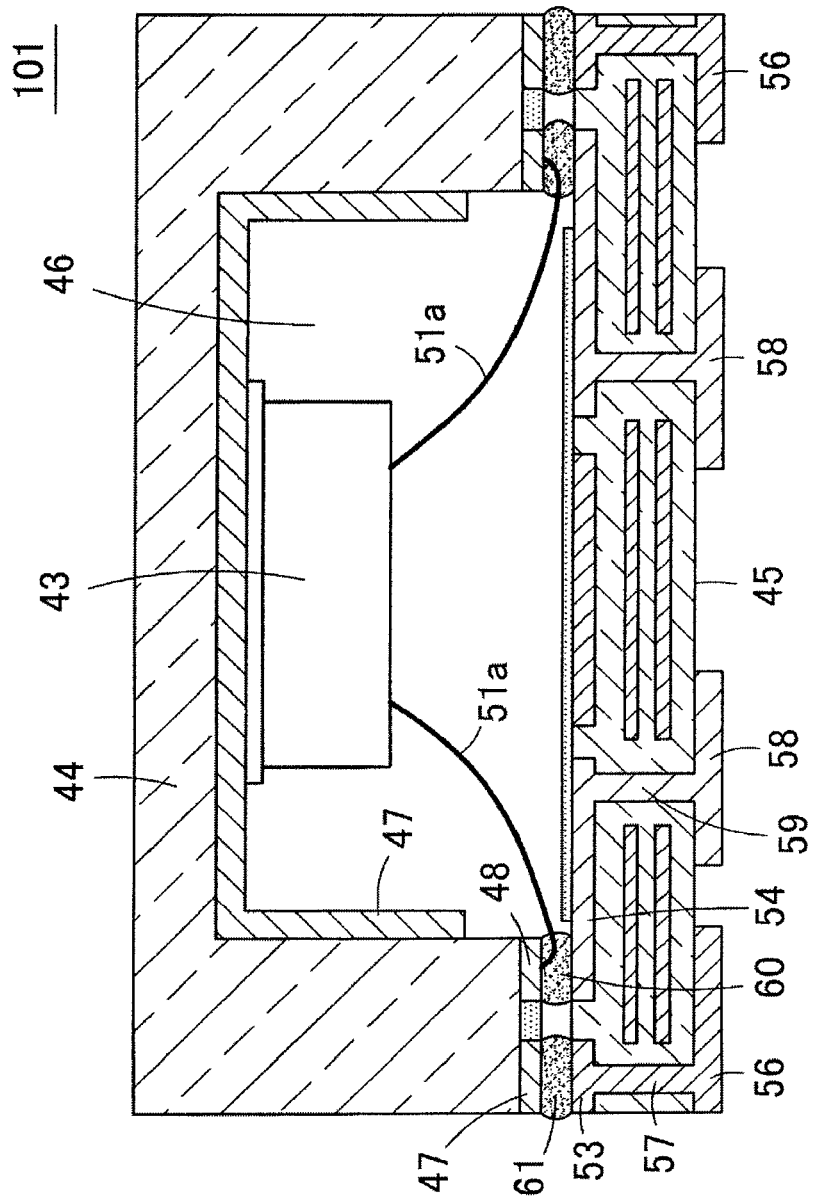
FIG. 15 is a cross-sectional view taken along the width direction of the microphone of the fifth embodiment.

FIG. 14 is a cross-sectional view taken along the longitudinal direction of a microphone 101 according to a fifth embodiment of the present invention, and FIG. 15 is a cross-sectional view taken along the width direction of the microphone 101.

In the microphone 101, a resin molded article molded in advance with premold resin, plastic, and the like, a ceramic calcined article, and the like are used for the cover 44. According to such embodiment, the range of selection of the cover material is greater, and thus distortion can be prevented from likely occurring at the microphone chip 42, for example, by selecting a material having a small difference in linear coefficient of expansion with the Si substrate of the microphone chip 42, thereby enhancing the accuracy and the reliability of the microphone 101.

Sixth Embodiment

Figure 16:
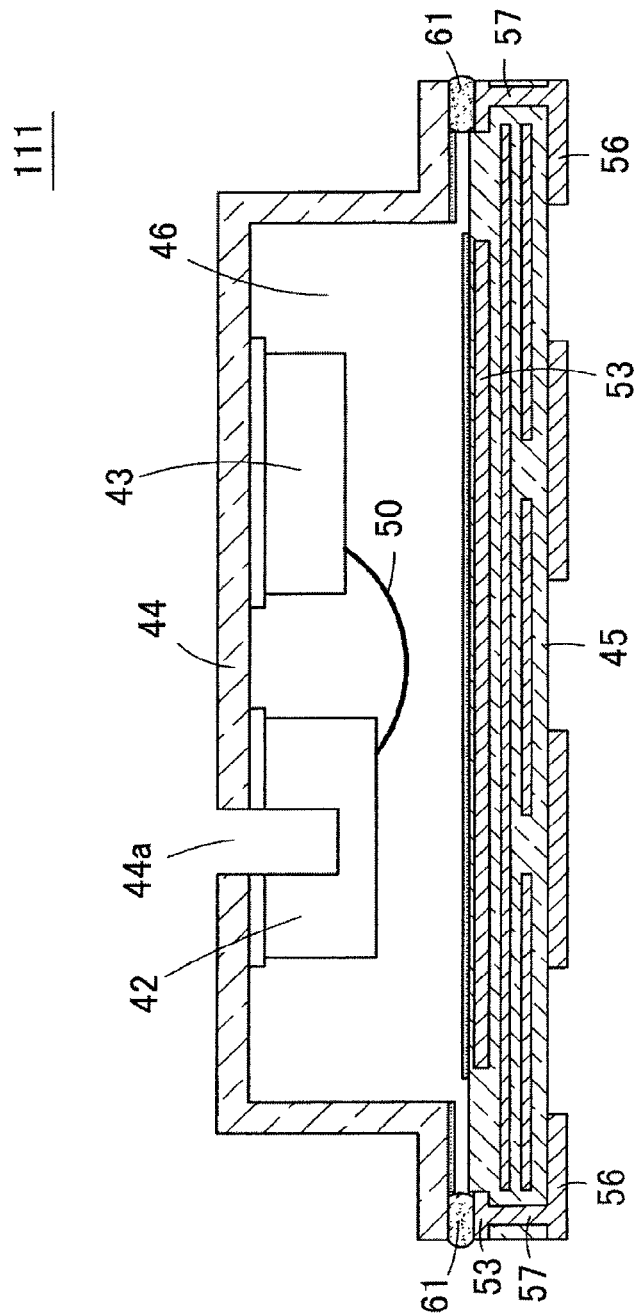
FIG. 16 is a cross-sectional view taken along the longitudinal direction of a microphone according to a sixth embodiment of the present invention.
Figure 17:
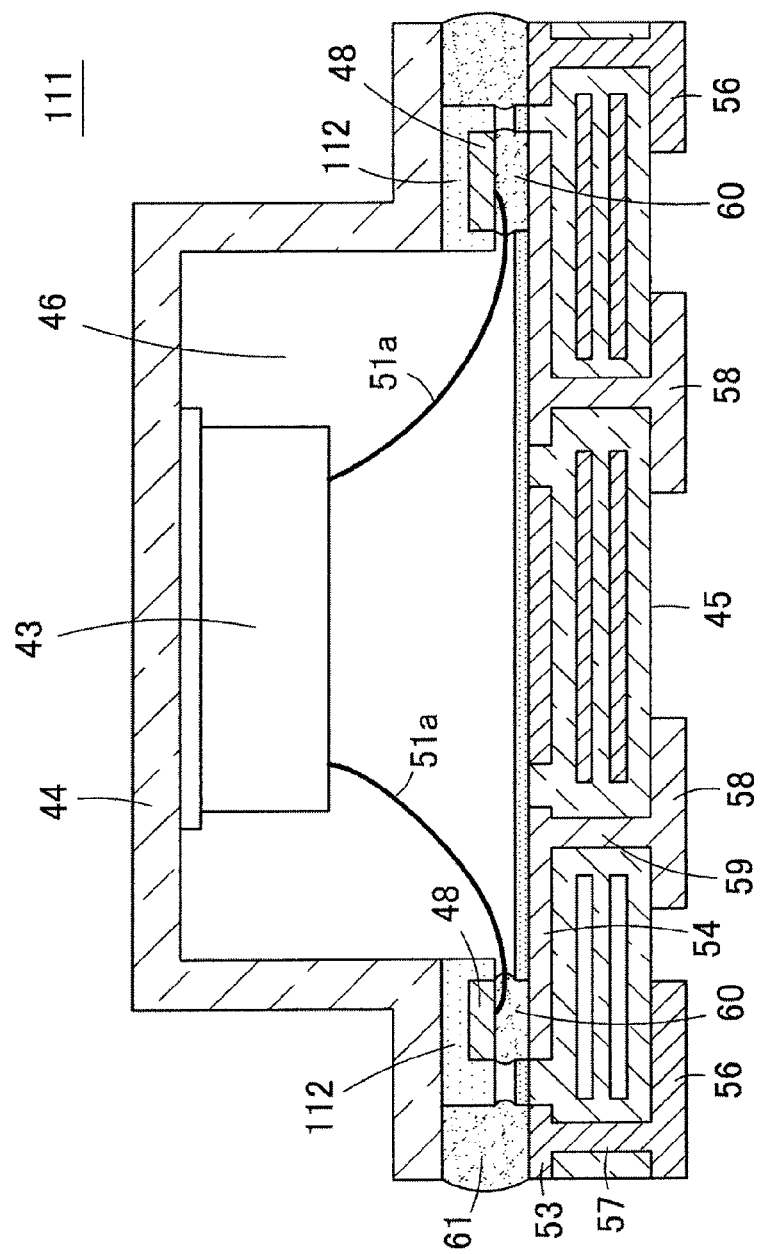
FIG. 17 is a cross-sectional view taken along the width direction of the microphone of the sixth embodiment.

FIG. 16 is a cross-sectional view taken along the longitudinal direction of a microphone 111 according to a sixth embodiment of the present invention, and FIG. 17 is a cross-sectional view taken along the width direction of the microphone 111.

In the microphone 111, the cover 44 formed with the recess 46 by press forming a metal plate is used. As shown in FIG. 16, the metal cover 44 has the lower surface at the outer peripheral parts joined to the conductive layer 53 of the substrate 45 by the conductive member 61. Therefore, the cover 44 itself is conducted with the conductive layer 53, and the entire cover 44 has the function of the electromagnetic shield. As shown in FIG. 17, in the area facing the exposed region of the connection electrode 54 of the substrate 45, an insulating layer 112 is formed at the lower surface of the cover 44 and the bonding pad 48 is arranged under the insulating layer 112. Therefore, the bonding pad 48 is insulated from the cover 44 by the insulating layer 112.

According to such embodiment, the structure can be simplified because the conductive layer 47 for electromagnetic shield does not need to be separately arranged on the cover 44, and the cost can be reduced.

The structures similar to the first embodiment are described in the fifth embodiment of FIG. 14 and FIG. 15, and the sixth embodiment of FIG. 16 and FIG. 17, but the structure in which the bonding pad 48 and the joining pad 73 are separated as in the second embodiment, the structure in which the depression 83 is formed in the substrate 45 as in the third embodiment, or the structure in which the step-down portion 92 is arranged in the cover 44 as in the fourth embodiment may be adopted.

Seventh Embodiment

Figure 18:
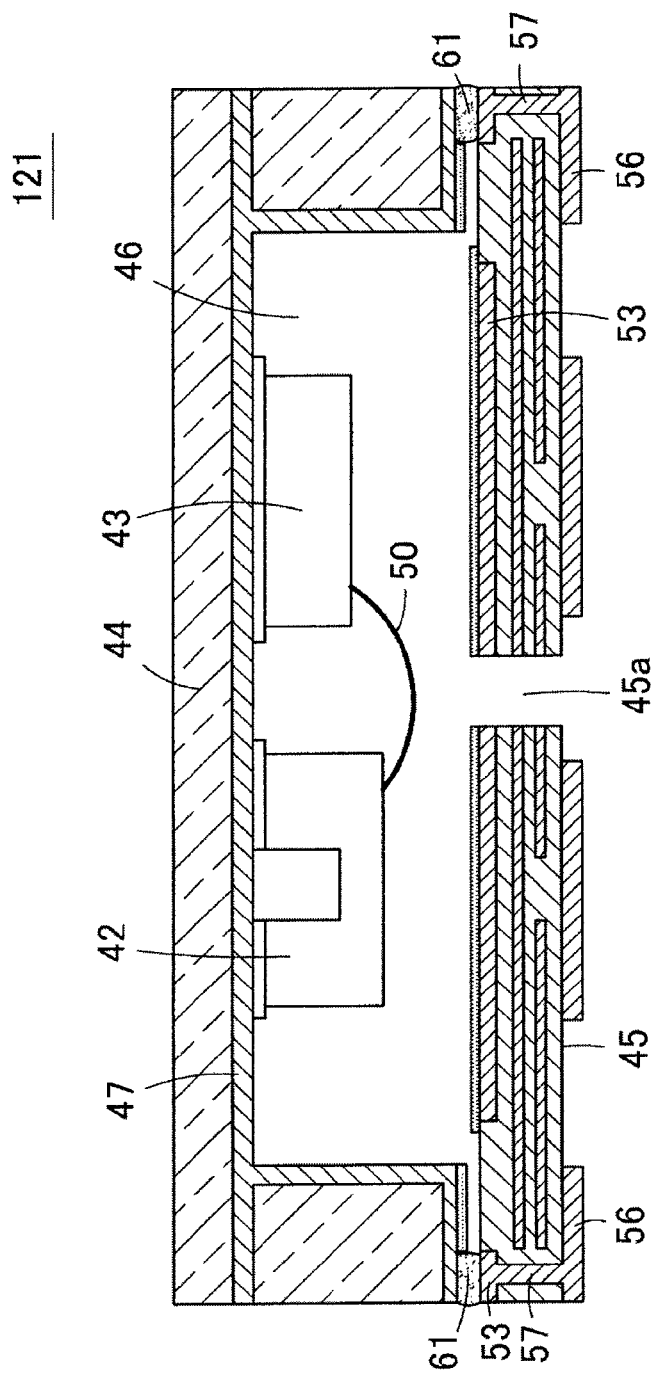
FIG. 18 is a cross-sectional view taken along the longitudinal direction of a microphone according to a seventh embodiment of the present invention.
Figure 19:
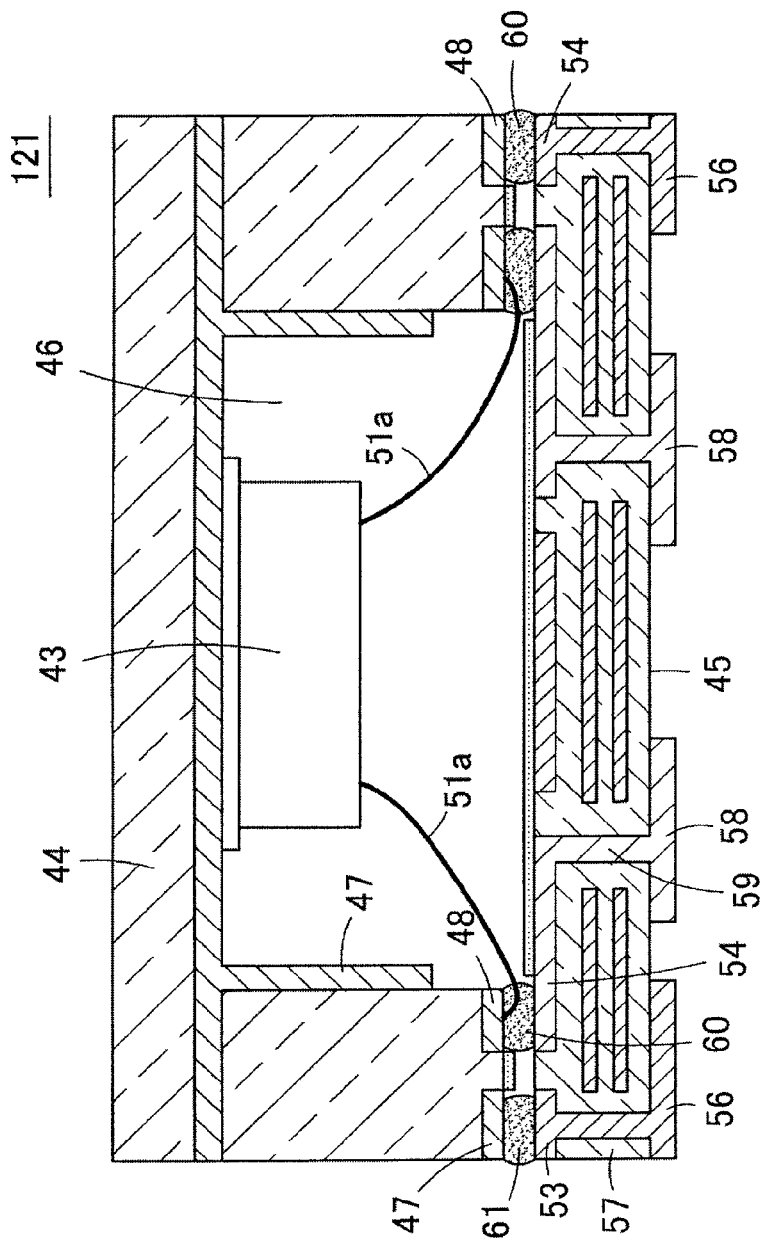
FIG. 19 is a cross-sectional view taken along the width direction of the microphone of the seventh embodiment.
Figure 20:
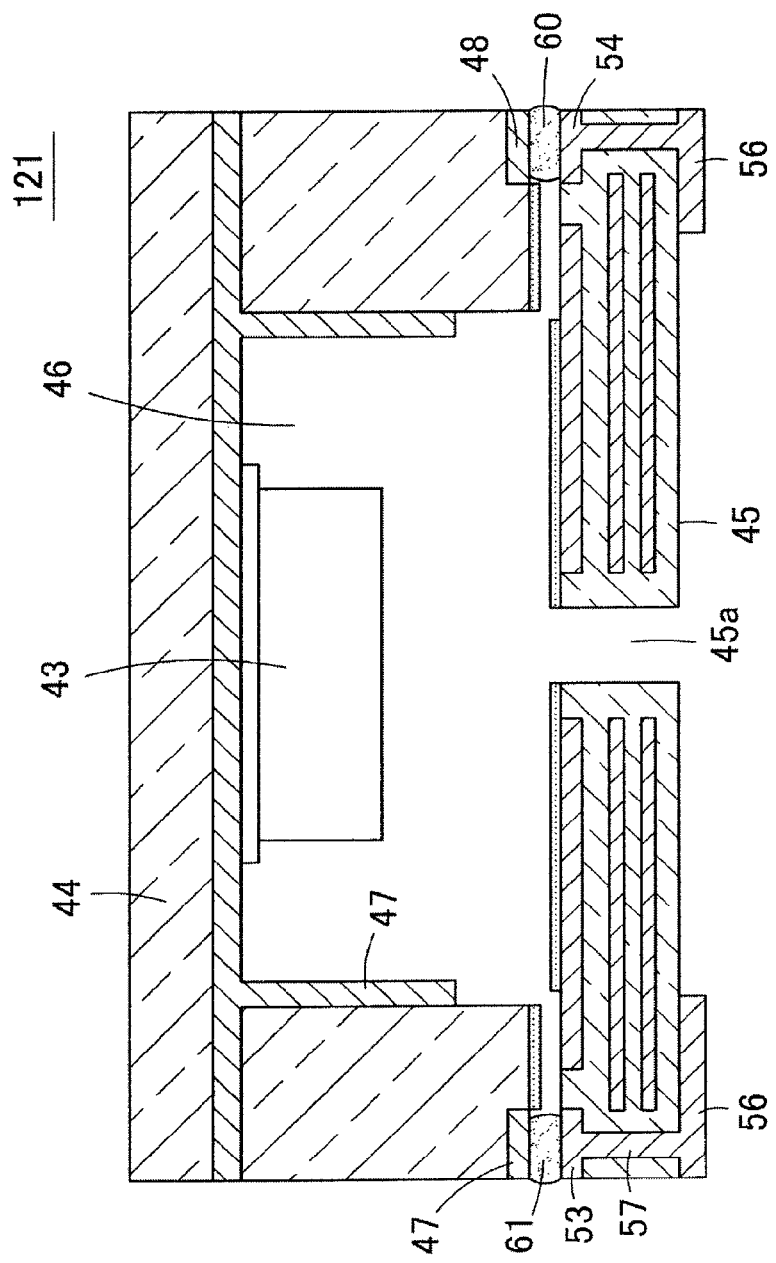
FIG. 20 is a cross-sectional view taken along the width direction at a different location of the microphone of the seventh embodiment.

FIG. 18 is a cross-sectional view taken along the longitudinal direction of a microphone 121 according to a seventh embodiment of the present invention, and FIG. 19 is a cross-sectional view taken along the width direction of the microphone 121. FIG. 20 is a cross-sectional view taken along the width direction at the position of the acoustic hole of the microphone 121. FIG. 21A is a bottom view of the cover 44 mounted with the microphone chip 42 and the circuit element 43, and FIG. 21B is a top view of the substrate 45.

The microphone 121 is a bottom port type microphone in which the acoustic hole 45a is formed in the substrate 45. The configuration other than the opening position of the acoustic hole 45a is the same as the first embodiment, and thus the same reference numerals are denoted as the first embodiment on the corresponding locations and the description will be omitted.

In the bottom port type microphone 121, the acoustic hole 45a is opened in the substrate 45, and thus the solder fume and the like may enter the package from the acoustic hole 45a when mounting the microphone 121 on the circuit substrate and the like of the applying device. Thus, the microphone chip 42 is mounted on the lower surface of the cover 44 away from the acoustic hole 45a so that the microphone chip 42 is not polluted by the solder fume, and the diaphragm does not cause sticking.

In the microphone 121 as well, the other end of the bonding wires 51a, 51b connected to the circuit element 43 is connected to the bonding pad 48 and the bonding portion 47a joined with the substrate 45 by the conductive members 60, 61 arranged on the lower surface of the cover 44, and thus the wire bonding of the other end can be easily carried out, the cost of the microphone 121 becomes inexpensive, and the microphone 121 can be miniaturized.

The acoustic hole is formed in the substrate in the microphone of the first embodiment in the seventh embodiment, but the acoustic hole may be formed in the substrate in the microphone of the second embodiment separated to the bonding pad 48 and the joining pad 73, the microphone of the third embodiment in which the depression 83 is formed in the substrate 45, the microphone of the fourth embodiment in which the step-down portion 92 is formed in the cover 44, the microphone of the fifth embodiment in which the resin molded article, the ceramic calcined article, or the like is used for the cover 44, and the microphone of the sixth embodiment using the cover 44 made of metal.

Eighth Embodiment

The application of the package structure according to one or more embodiments of the present invention is not limited to the microphone, and can also be used in a semiconductor device accommodating various sensors, IC circuits and the like.

Figure 22:
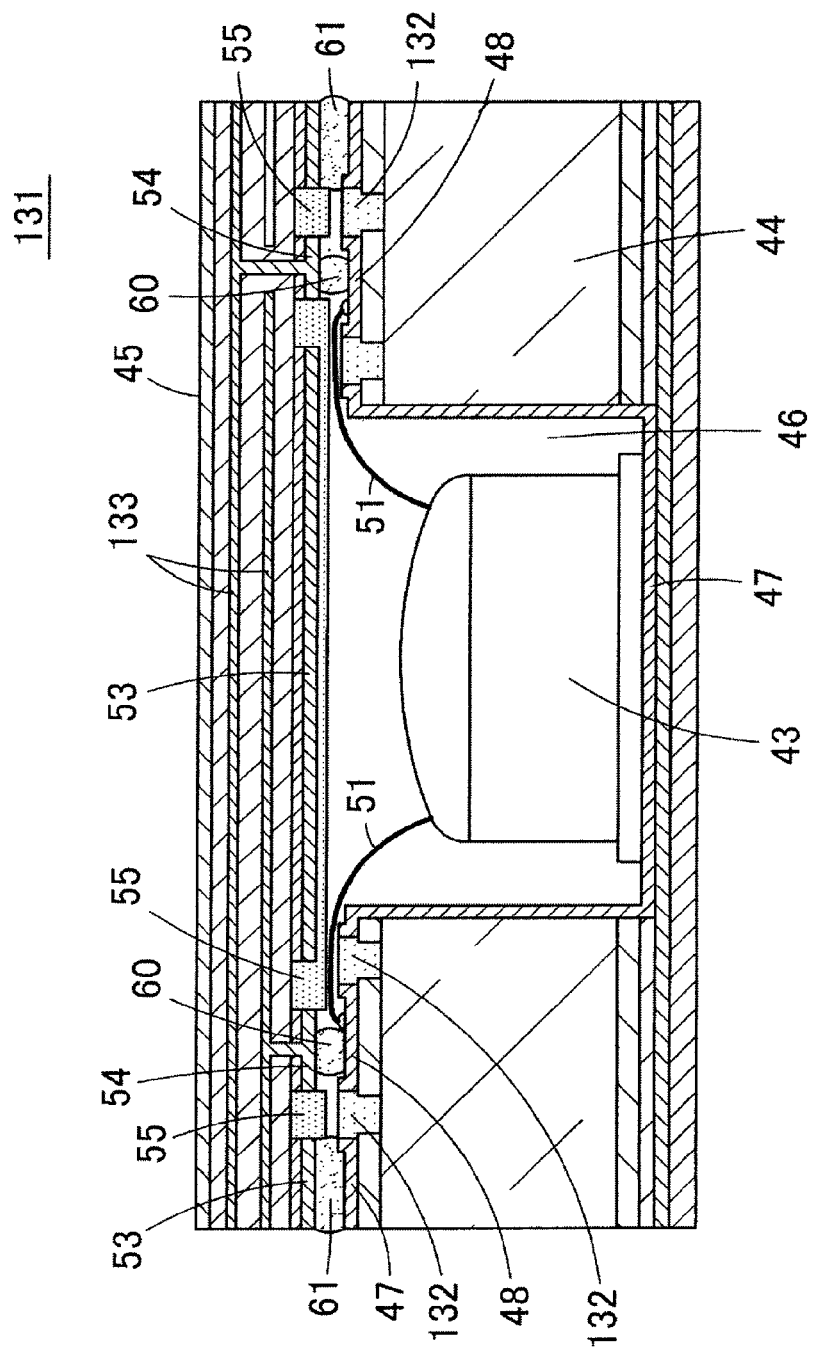
FIG. 22 is a cross-sectional view taken along the width direction of a semiconductor device according to an eighth embodiment of the present invention.

An eighth embodiment of the present invention will be described with reference to FIG. 22 to FIG. 26. A semiconductor device 131 accommodates a sensor 134 and the circuit element 43 in a package including the cover 44 and the substrate 45, wherein copper-clad laminate, glass epoxy substrate, paper epoxy substrate, and the like is used for the cover 44 in the semiconductor device 131 of the eighth embodiment. FIG. 22 is a cross-sectional view of the semiconductor device 131 according to the eighth embodiment of the present invention. FIG. 23A is a plan view of the cover 44 (first member) mounted with the sensor 134 and the circuit element 43, and FIG. 23B is a bottom view of the substrate 45 (second member) applied with the conductive members 60, 61. The cover 44 is attached to the lower surface of the substrate 45 in the figures, but this merely suggests the manufacturing steps and the semiconductor device 131 may be arbitrarily oriented in the usage stage.

As shown in FIG. 22 and FIG. 23A, the cover 44 includes the box-shaped recess 46 for accommodating the sensor 134 and the circuit element 43. As will be described in the manufacturing method, the cover 44 is formed by a copper-clad laminate with a through-hole and a bottom surface substrate. The recess 46 has the bottom surface closed and the upper surface opened. The conductive layer 47 for electromagnetic shield is formed almost entirely at the bottom surface and the side wall surface of the recess 46 and the upper surface of the cover 44 at outside the recess 46. A plurality of bonding pads 48 is formed near the recess 46 at the exterior of the recess 46, that is, the upper surface of the cover 44. The conductive layer 47 and the bonding pad 48 are formed by a metal film, but the periphery of the bonding pad 48 is separated from the conductive layer 47, wherein each bonding pad 48 and the conductive layer 47 are insulated from each other by filling an insulating portion 132 made from an insulating material such as photoresist at the periphery of the bonding pad 48 in a frame-form.

The sensor 134 is an MEMS element such as an acoustic sensor, an acceleration sensor, or a flow rate sensor, and the circuit element 43 is an element such as an IC chip or an ASIC. The sensor 134 and the circuit element 43 have the respective lower surface fixed to the bottom surface of the recess 46 by an adhesive. The terminal arranged on the upper surface of the sensor 134 and the terminal arranged on the upper surface of the circuit element 43 are connected by the bonding wire 50. One end of the bonding wire 51 is bonded to the terminal arranged on the surface of the circuit element 43, and the other end of the bonding wire 51 is bonded to the bonding pad 48. In FIG. 23A, the bonding pad 48 is arranged in the vicinity of the circuit element 43, but the bonding pad 48 may also be appropriately arranged in the vicinity of the sensor 134 when connecting the sensor 134 and the bonding pad 48 with the bonding wire.

As shown in FIG. 22 and FIG. 23B, the substrate 45 includes a multi-layered wiring substrate, and an input/output wiring 133 for signal input/output is arranged in the substrate 45. The connection electrode 54 is arranged facing the bonding pad 48 at the lower surface of the substrate 45, and the conductive layer 53 for electromagnetic shield is arranged over substantially the entire surface excluding the connection electrode 54 and the periphery thereof. The connection electrode 54 and the conductive layer 53 are formed by a metal film, and the periphery of the connection electrode 54 is separated from the conductive layer 53. The lower surface of the conductive layer 53 is covered by the solder resist 55 in the region excluding the outer peripheral part of the connection electrode 54 and the conductive layer 53, and the solder resist 55 is also filled between the connection electrode 54 and the conductive layer 53. The connection electrode 54 is electrically conducted to the input/output wiring 133 in the substrate 45.

As shown in FIG. 22, the substrate 45 is overlapped on the upper surface of the cover 44, and the opposing bonding pad 48 and the connection electrode 54 are joined by the conductive member 60 such as a conductive adhesive or solder, a conductive double-sided adhesive tape, a wax material for welding, or the like. The region exposed from the solder resist 55 at the outer peripheral part of the substrate of the conductive layer 53 is joined to the outer peripheral part of the conductive layer 47 by the conductive member 61 such as a conductive adhesive or solder, a conductive double-sided adhesive tape, a wax material for welding, or the like. Therefore, the circuit element 43 is connected to the input/output wiring 133 through the bonding wire 51, the conductive member 60, and the like. The conductive layer 47 is electrically conducted with the conductive layer 53 by the conductive member 61, and hence the interior of the semiconductor device 131 is electromagnetically shielded by connecting the conductive layer 53 to ground potential.

(Manufacturing Method)

Figure 24A:
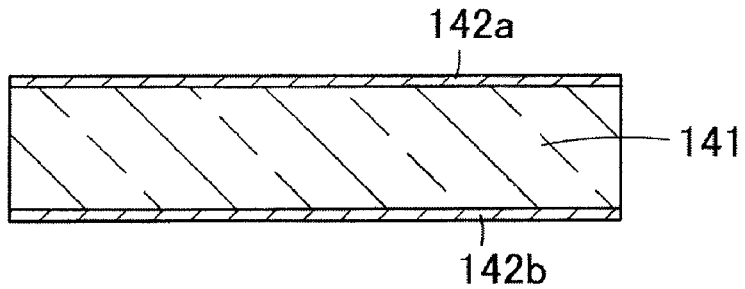
FIGS. 24A to 24E are schematic cross-sectional views showing the manufacturing process of the semiconductor device according to the eighth embodiment.
Figure 24B:
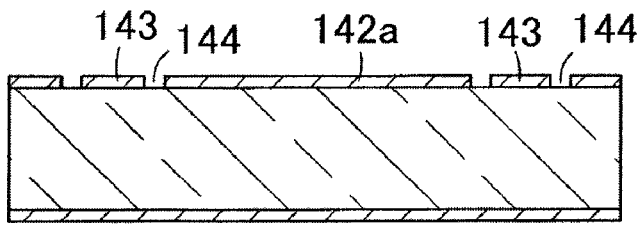
Figure 24C:
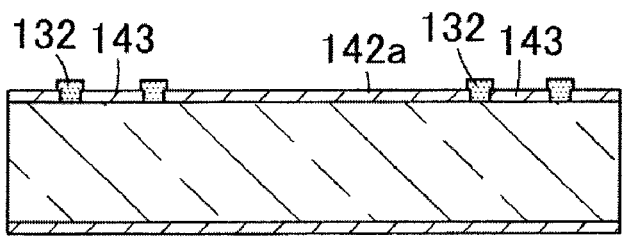

The manufacturing process of the semiconductor device 131 will now be described with FIGS. 24A to 24E, FIGS. 25A to 25C, and FIGS. 26A to 26D. FIG. 24A shows the raw material of the cover 44, and is for example, a copper-clad laminate 141 having two copper layers in which copper foils 142a, 142b are bonded on both upper and lower surfaces. As shown in FIG. 24B, the copper foil 142a on the upper surface has a separation groove 144 formed by removing the periphery of the region to form the bonding pad 48 by etching, and an island 143 formed in the region to form the bonding pad 48. The photoresist is then applied on the upper surface of the copper-clad laminate, and the photoresist is patterned using the photolithography technique so that the photoresist remains only at the portion of the separation groove 144. As a result, the insulating portion 132 is formed to a projecting frame form at the periphery of the island 143 by the cured photoresist, as shown in FIG. 24C.

Figure 24D:
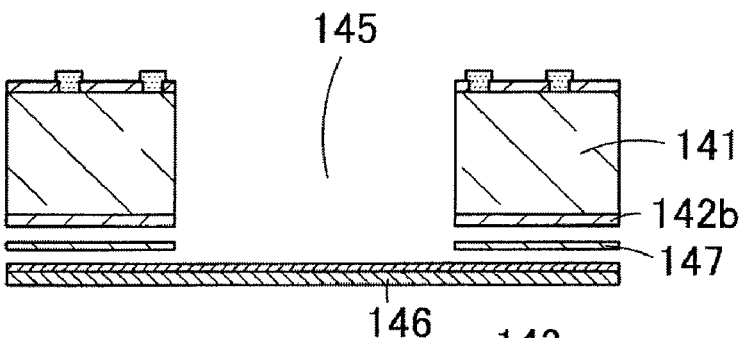
Figure 24E:
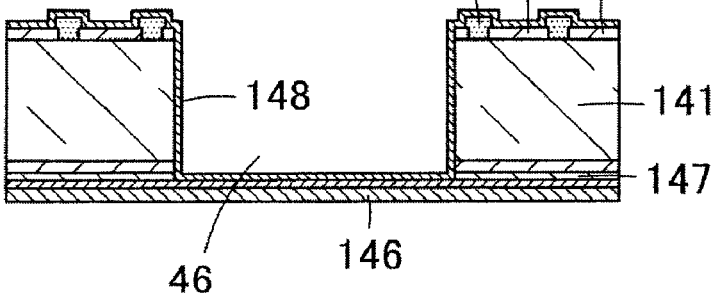

Thereafter, as shown in FIG. 24D, a through-hole 145 is formed in the copper-clad laminate 141 in accordance with the region to become the recess 46 using a router and a drill. A bottom surface substrate 146 is then attached to the entire lower surface of the copper-clad laminate 141 by the double-sided adhesive tape 147, and the lower surface of the through-hole 145 is closed with the bottom surface substrate 146 to thereby form the recess 46 in the copper-clad laminate 141. The bottom surface substrate 146 is not limited to a hard substrate, and may be a tape or a sheet having heat resistance.

After attaching the bottom surface substrate 146 to the copper-clad laminate 141 and forming the recess 46, the metal film 148 is formed over the entire inner surface of the recess 46 and the upper surface of the copper-clad laminate 141 through methods such as vapor deposition and sputtering.

Figure 25A:
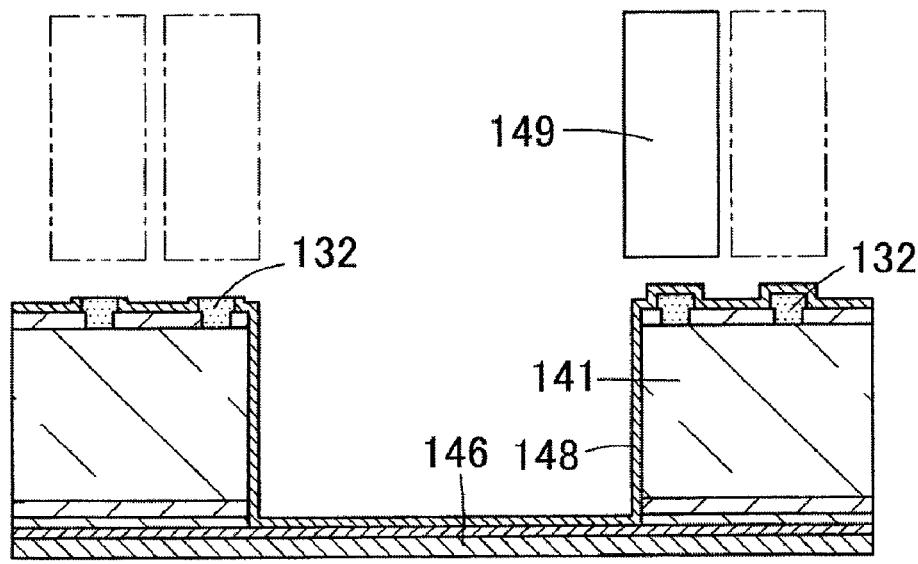
FIGS. 25A to 25C are schematic cross-sectional views showing the manufacturing process of the semiconductor device according to the eighth embodiment, showing the process following FIG. 24E.
Figure 25B:
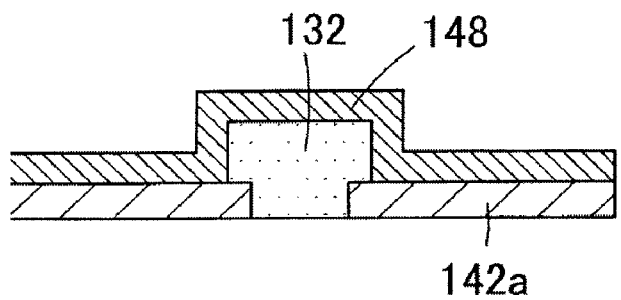
Figure 25C:
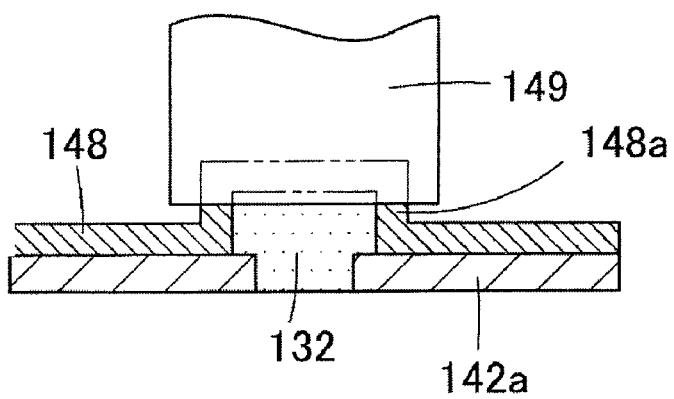

As shown in FIG. 25B, the metal film 148 covering the insulating portion 132 is raised than the periphery because the height of the insulating portion 132 is greater than the thickness of the copper foil 142a. Then, as shown in FIG. 25A, the metal film 148 raised on the insulating portion 132 is cut horizontally with a dicer 149 or grounded with a grinder to expose the upper surface of the insulating portion 132. In this case, as shown in FIG. 25C, the portion of the insulating portion 132 is remained projecting than the periphery without being cut flat to form a raised portion 148a of the metal film 148 on both side surfaces of the insulating portion 132.

Figure 26A:
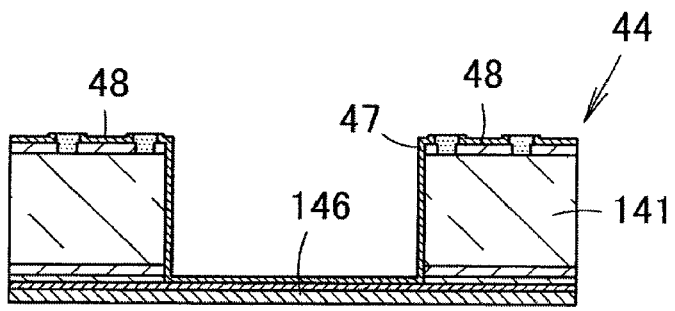
FIGS. 26A to 26D are schematic cross-sectional views showing the manufacturing process of the semiconductor device according to the eighth embodiment, showing the process following FIGS. 25A to 25C.

When the metal film 148 covering the upper surface of the insulating portion 132 is removed to expose the upper surface of the insulating portion 132, the metal film 148 of the region surrounded with the insulating portion 132 becomes the bonding pad 48 and the other regions become the conductive layer 47 for electromagnetic shield, as shown in FIG. 26A. Furthermore, because the insulating portion 132 and the metal film 148 on both side surfaces thereof are projecting upward, the conductive member 60 for joining the bonding pad 48 and the connection electrode 54 and the conductive member 61 for joining the conductive layer 47 and the conductive layer 53 are prevented from flowing out over the insulating portion 132 and short-circuiting the circuits when the cover 44 and the substrate 45 are joined with the conductive members 60, 61.

Figure 26B:
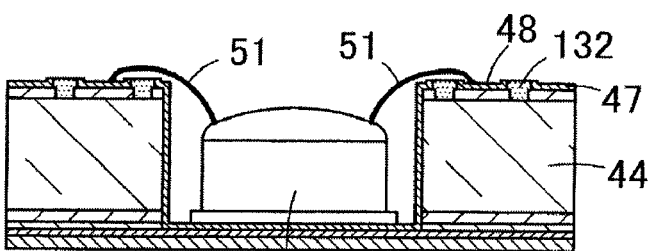

As shown in FIG. 26B, after the cover 44 is formed, the sensor 134 and the circuit element 43 are accommodated in the recess 46 to adhere and fix the bottom surface, the sensor 134 and the circuit element 43 are connected with the bonding wire 50, and then the circuit element 43 and the bonding pad 48 are wire connected with the bonding wire 51.

Figure 26C:
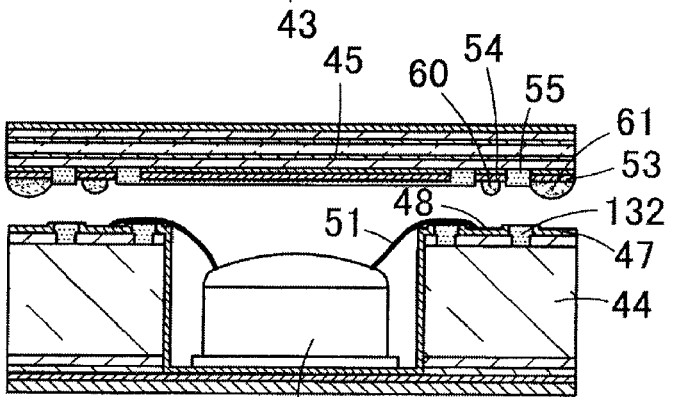
Figure 26D:
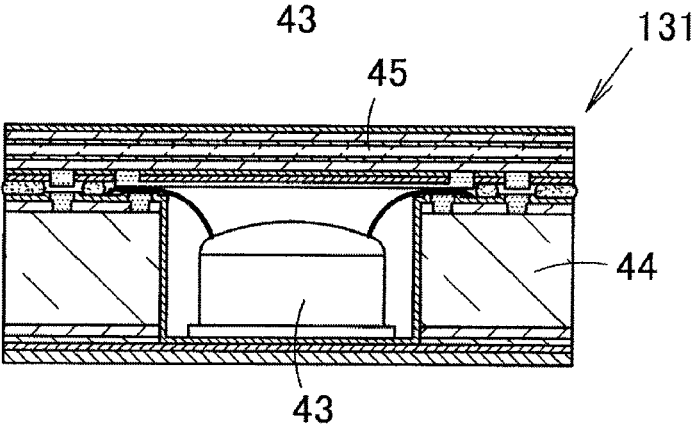

Thereafter, the conductive member 61 is applied to the outer peripheral part of the lower surface of the substrate 45 as shown in FIG. 23B, which is separately formed, and the conductive member 60 is applied to the connection electrode 54, the substrate 45 is overlapped on the cover 44, as shown in FIG. 26C, and the bonding pad 48 and the connection electrode 54 are joined with the conductive member 60 and the conductive layer 47 and the conductive layer 53 are joined with the conducive member 61, as shown in FIG. 26D.

According to the semiconductor device 131, the wire bonding of the bonding wire 51 to the bonding pad 48 of the cover 44 does not need to be carried out in the recess 46 and can be carried out on the upper surface of the cover 44, and hence the area of the recess 46 can be reduced and the semiconductor device 131 can be miniaturized. The other end of the bonding wire 51, which has one end connected to the circuit element 43, is directly connected to the bonding pad 48 arranged on the upper surface of the cover 44, and thus the conductor wiring etc. do not need to be arranged in the recess 46, the structure of the semiconductor device 131 can be simplified, and the cost of the package can be lowered.

Ninth Embodiment

Figure 27:
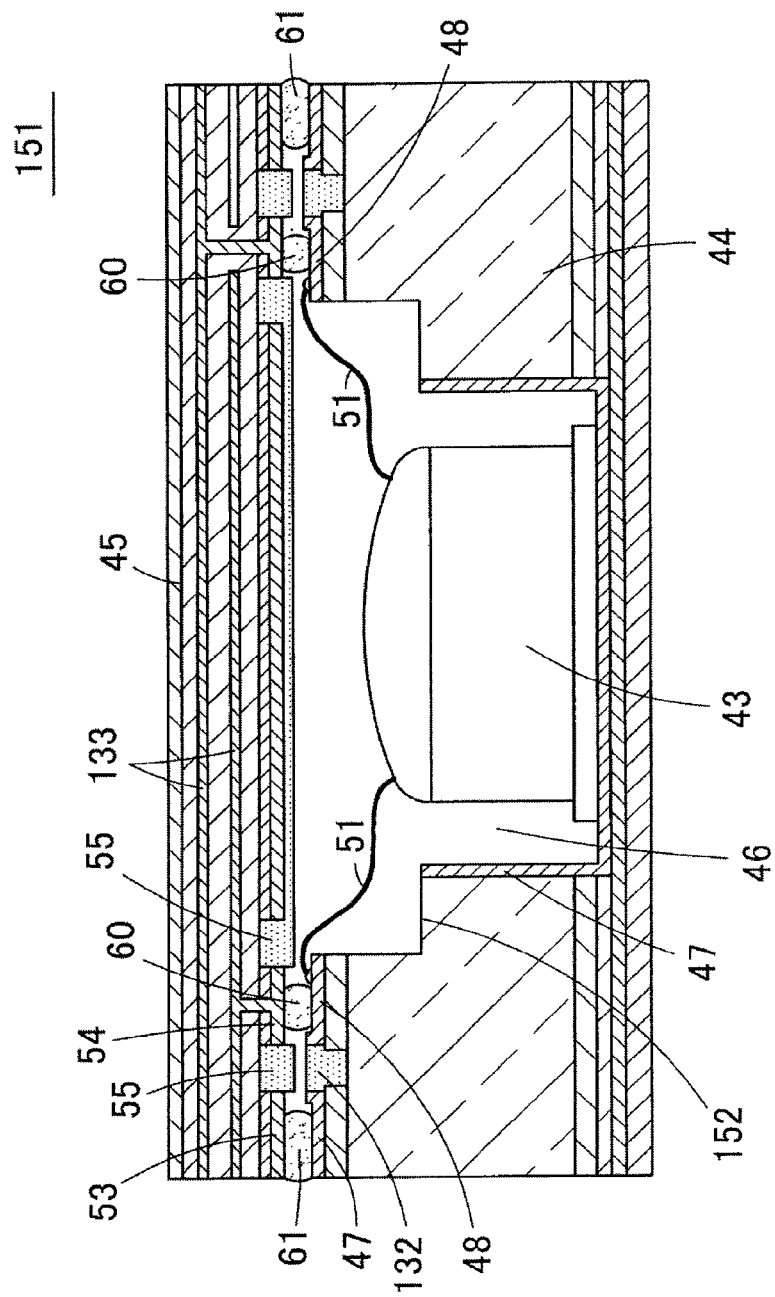
FIG. 27 is a cross-sectional view taken along the width direction of a semiconductor device according to a ninth embodiment of the present invention.

FIG. 27 is a cross-sectional view showing a semiconductor device 151 according to a ninth embodiment of the present invention. FIGS. 28A and 28B are a plan view of the cover 44 used in the semiconductor device 151 of the ninth embodiment and a plan view of the substrate 45.

In the case of the ninth embodiment, the tip of the bonding wire 51 is connected to the bonding pad 48 arranged on the upper surface of the cover 44, and thus the bonding wire 51 may touch the conductive layer 47 at the corner of the upper end of the recess 46 and short circuit when hanged down. In such a case, the cover 44 and the conductive layer 47 may be cutout at the corner where the side wall of the recess 46 and the upper surface of the cover 44 intersect to form a cutout 152 at the position where the bonding wire 51 passes, as shown in FIG. 27 and FIG. 28.

The cutout 152 may be formed by performing cutting work on the copper-clad laminate 141 and the conductive layer 47 with the router and the drill.

According to such semiconductor device 151, short circuit is less likely to occur with the conductive layer 47 even if the bonding wire 51 hangs down, as shown in FIG. 27.

Tenth Embodiment

Figure 29:
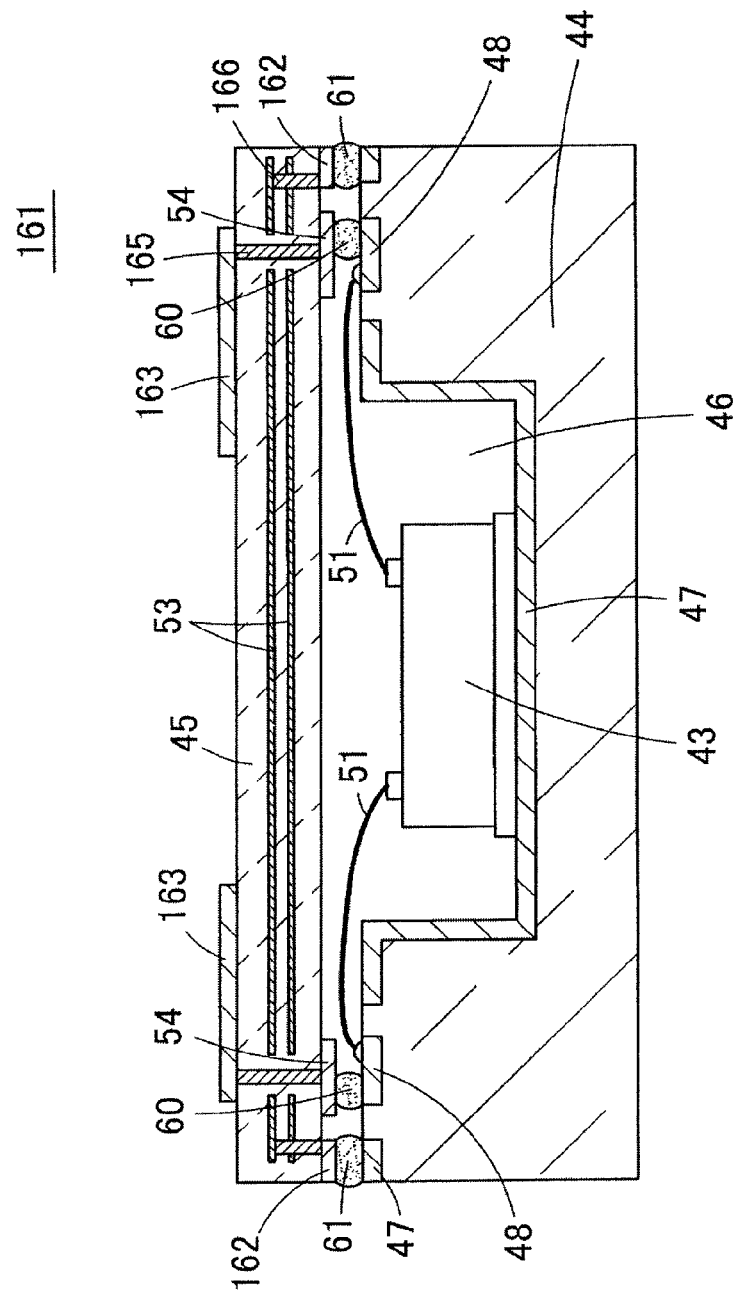
FIG. 29 is a cross-sectional view taken along the width direction of a semiconductor device according to a tenth embodiment of the present invention.

A semiconductor device 161 according to a tenth embodiment of the present invention is an embodiment using the cover 44 of a molded article. FIG. 29 is a cross-sectional view showing the semiconductor device 161. The cover 44 is a resin molded article made of non-conductive resin, and has the recess 46 formed at the upper surface. The conductive layer 47 for electromagnetic shield and the bonding pad 48 are formed at the inner surface of the recess and the upper surface of the cover 44. The sensor 134 and the circuit element 43 are mounted on the bottom surface in the recess 46, wherein the circuit element 43 and the bonding pad 48 are wire connected with the bonding wire 51.

The substrate 45 for the package includes a multi-layered wiring substrate, the conductive layer 53 for electromagnetic shield is arranged in the substrate 45, and an external connection terminal 163 serving as the signal input/output unit is arranged on the upper surface of the substrate 45. The connection electrode 54 conducted with the external connection terminal 163 by a via hole 165 is arranged to face the bonding pad 48 at the lower surface of the substrate 45, and a ground electrode 162 conducted with the conductive layer 53 by a via hole 166 is arranged at the outer peripheral part.

The substrate 45 is overlapped on the upper surface of the cover 44, and the bonding pad 48 connected with the bonding wire 51 is connected with the connection electrode 54 by the conductive member 60, and the conductive layer 47 is connected to the ground electrode 162 by the conductive member 61.

(Manufacturing Method)

FIGS. 30A to 30C and FIGS. 31A to 31C are schematic cross-sectional views showing the manufacturing process of the semiconductor 161 of the tenth embodiment. The manufacturing process of the semiconductor device 161 will be described below according to the drawings.

Figure 30A:
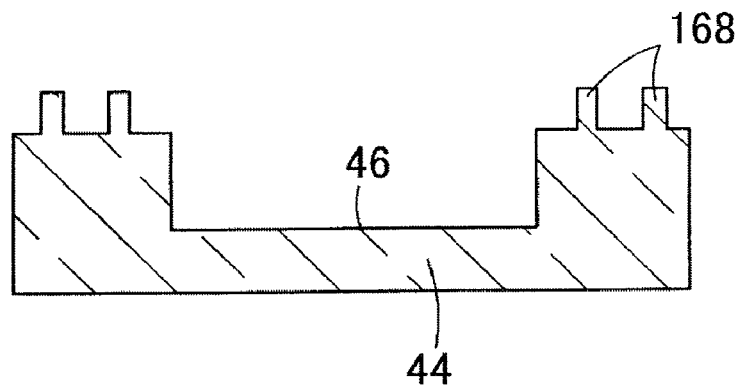
FIGS. 30A to 30C are schematic cross-sectional views showing the manufacturing process of the semiconductor device according to the tenth embodiment.
Figure 30B:
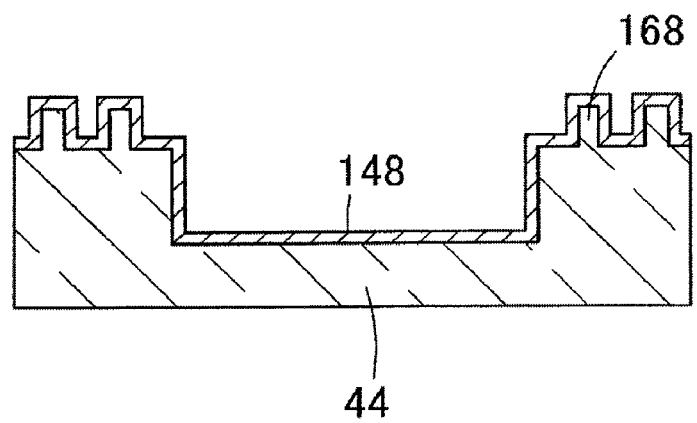
Figure 30C:
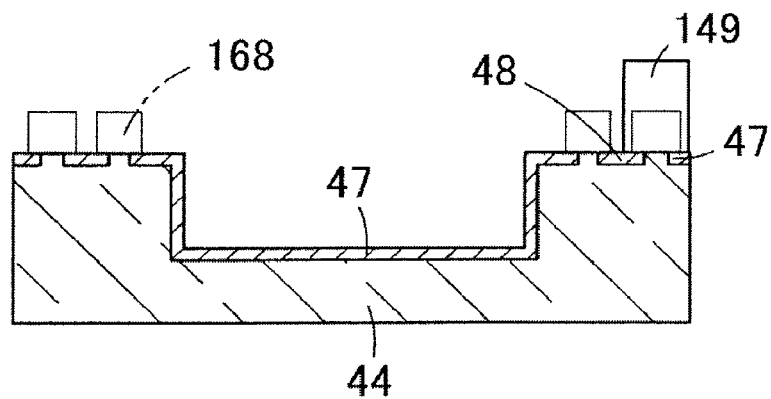
Figure 31A:
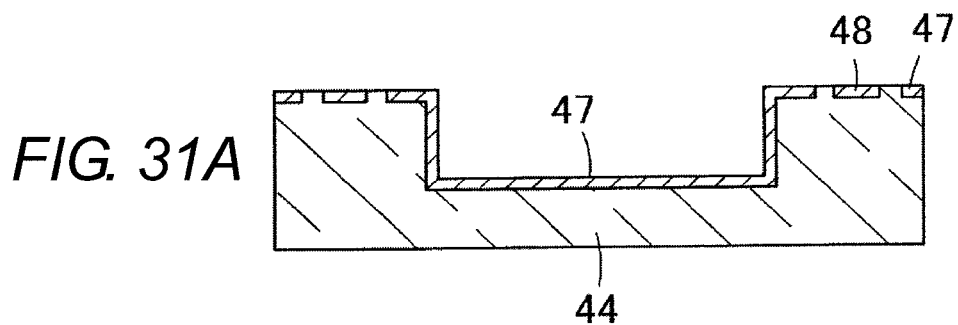
FIGS. 31A to 31C are schematic cross-sectional views showing the manufacturing process of the semiconductor device according to the tenth embodiment, showing the process following FIG. 30C.

FIG. 30A shows the cover 44 molded from a non-conductive resin, where the box-shaped recess 46 is arranged at the upper surface thereof, and a frame-like projection 168 is arranged to surround the region to form the bonding pad 48 at the exterior of the recess 46. As shown in FIG. 30B, a metal film 148 is formed by performing metal plating over the entire inner surface of the recess 46 of the cover 44 and the entire upper surface at the exterior of the recess 46. As shown in FIG. 30C, the frame-like projection 168 is scraped off with the dicer 149 or the grinder, and the metal film 148 is partially removed in the region where the frame-like projection 168 is projected to expose the cover 44. As a result, the bonding pad 48 is formed in the region surrounded with the frame-like projection 168, and the conductive layer 47 is formed in other regions as shown in FIG. 31A. Furthermore, the periphery of the bonding pad 48 is separated from the conductive layer 47, and the bonding pad 48 and the conductive layer 47 are insulated from each other by the cover 44 exposed at the area where the frame-like projection 168 existed.

Figure 31B:
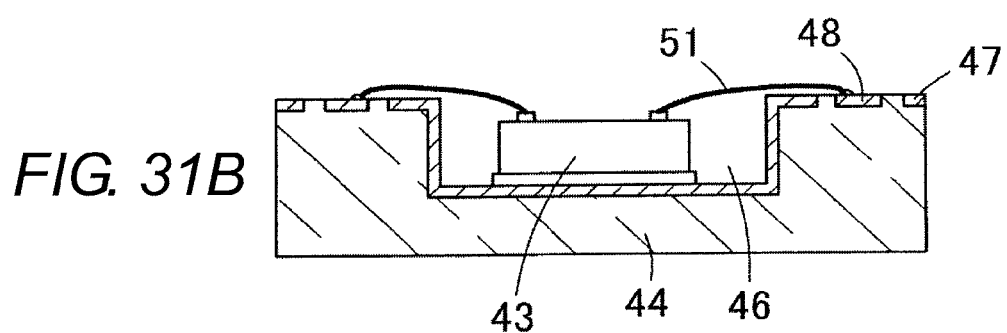
Figure 31C:
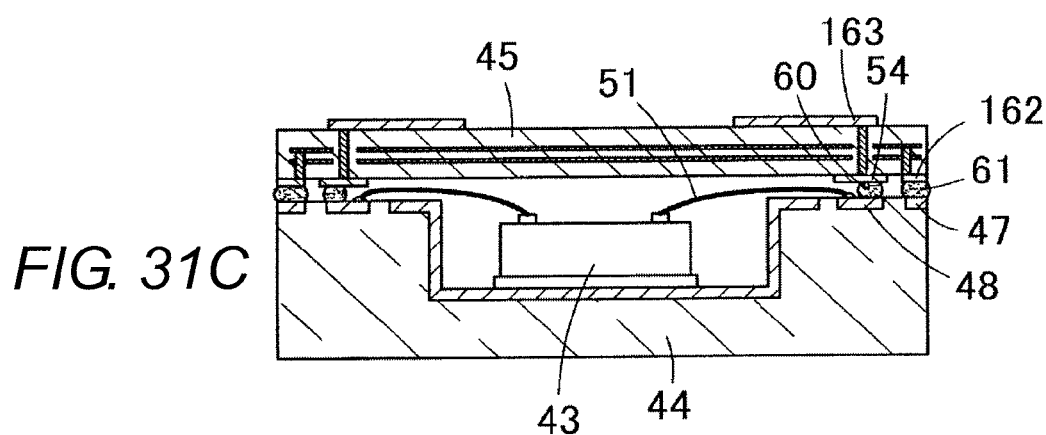

Thereafter, the sensor 134 and the circuit element 43 are accommodated in the recess 46 and fixed with an adhesive as shown in FIG. 31B, and then the sensor 134 and the circuit element 43 are connected with the bonding wire 50. The circuit element 43 and the bonding pad 48 are wire connected with the bonding wire 51.

The substrate 45 is then overlapped on the cover 44, and the bonding pad 48 and the connection electrode 54 are connected with the conductive member such as the conductive adhesive, the solder, and the like, and the outer peripheral parts of the conductive layer 47 and the ground electrode 162 are connected by the conductive member 61 such as the conductive member, the solder, and the like.

According to the method of arranging the frame-like projection 168 on the upper surface of the cover 44 in advance, the conductive layer 47 and the metal film 148 can be easily patterned by simply cutting or grinding the portion of the frame-like projection 168 and removing the frame-like projection 168 after forming the metal film 148.

Eleventh Embodiment

FIG. 32 shows a semiconductor device 171 according to an eleventh embodiment of the present invention and the manufacturing process thereof. The semiconductor device 171 uses a metal plate for the cover 44. First, as shown in FIG. 32A, in the manufacturing process of the semiconductor device 171, a metal plate such as a copper plate, copper foil, aluminum plate, aluminum foil, or iron plate is press formed to form the recess 46 in the cover 44. Then, as shown in FIG. 32B, an insulating film 173 is formed on the upper surface of a flange 172 of the cover 44. The order of FIG. 32A and FIG. 32B may be reversed, and the metal plate may be press formed after arranging the insulating film 173 at the edge of the metal plate.

Subsequently, the bonding pad 48 is arranged on the insulating film 173 to arrange the bonding pad 48 insulated from the cover 44, as shown in FIG. 32C. Then, as shown in FIG. 32D, the sensor 134 and the circuit element 43 are mounted on the bottom surface of the recess 46, the circuit element 43 and the sensor 134 are connected with the bonding wire 50, and the circuit element 43 and the bonding pad 48 are connected with the bonding wire 51.

Lastly, the substrate 45 is overlapped on the cover 44, the bonding pad 48 of the cover 44 and the connection electrode 54 of the substrate 45 are joined with the conductive member 60, and the flange 172 of the cover 44 and the conductive layer 53 of the substrate 45 are joined with the conductive member 61.

In the embodiments described above, the microphone or the sensor and the circuit element are arranged in the package, but the microphone or the sensor, or the circuit element alone may be singularly accommodated in the package.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A semiconductor device comprising:
   a first member and a second member for configuring a package;
   a semiconductor element mounted on the first member by being accommodated in a recess formed in the first member;
   a bonding pad arranged at an outer edge away from a bottom surface of the recess of the first member;
   a wire wiring for electrically connecting the semiconductor element and the bonding pad;
   a signal input/output unit arranged on the second member;
   a second joint portion conducted with the signal input/output unit arranged in the second member; and
   a conduction unit for electrically conducting the bonding pad and the second joint portion.

2. The semiconductor device according to claim 1, wherein the second member has a depression in a surface facing the recess.

3. The semiconductor device according to claim 1, further comprising:
   a first joint portion arranged on a surface facing the second member of the first member and conducted with the bonding pad,
   wherein the conduction unit connects the first joint portion and the second joint portion.

4. The semiconductor device according to claim 3, wherein both of the bonding pad and the first joint portion are arranged on surfaces of which normal directions are along the same direction of the first member.

5. The semiconductor device according to claim 3, wherein the bonding pad and the first joint portion are arranged respectively on surfaces of which normal directions are along different directions of the first member.

6. The semiconductor device according to claim 3, wherein the bonding pad and the first joint portion are positioned in a same plane parallel to a bottom surface of the recess.

7. The semiconductor device according to claim 3, wherein the bonding pad and the first joint portion are positioned in different planes parallel to a bottom surface of the recess.

8. The semiconductor device according to claim 3, wherein an outer peripheral edge of the first joint portion is higher than a region on the inner side.

9. The semiconductor device according to claim 1, wherein the first member is formed from at least one material from a group consisting of copper-clad laminate, glass epoxy, ceramic, plastic, metal, and carbon nanotube or a complex material thereof.

10. The semiconductor device according to claim 1, wherein the second member is formed from at least one material from a group consisting of copper-clad laminate, glass epoxy, ceramic, plastic, metal, and carbon nanotube or a complex material thereof.

11. The semiconductor device according to claim 1, wherein the first member and the second member have an electromagnetic shield function for shielding external electromagnetic noise.

12. The semiconductor device according to claim 1, wherein the conduction unit is at least one of a solder, a conductive resin, a conductive tape, or a wax material.

13. The semiconductor device according to claim 1, wherein the first member and the second member are joined by simultaneously using a non-conductive resin or a non-conductive tape.

14. The semiconductor device according to claim 1,
   wherein a sensor and a circuit element are arranged as the semiconductor element,
   wherein the other end of the wire wiring, which has one end connected to the circuit element or the sensor, is connected to one of the bonding pad, and
   wherein the other end of another wire wiring, which has one end connected to the circuit element or the sensor, is connected to a different one of the bonding pad.

15. A microphone in which the sensor of claim 14 is a microphone chip,
   wherein the first member is a cover of the package, and the second member is a substrate of the package, and
   wherein an acoustic hole is opened in the cover and the microphone chip is attached to the cover to cover the acoustic hole.

16. A microphone in which the sensor of claim 14 is a microphone chip,
   wherein the first member is a cover of the package, and the second member is a substrate of the package, and
   wherein an acoustic hole is opened in the substrate.

* * * * *